(12) United States Patent
Pedersen et al.

(10) Patent No.: US 12,212,304 B1
(45) Date of Patent: *Jan. 28, 2025

(54) RESONATOR ELECTRODE SHIELDS

(71) Applicant: SiTime Coporation, Santa Clara, CA (US)

(72) Inventors: David Raymond Pedersen, Portland, OR (US); Aaron Partridge, Cupertino, CA (US); Thor Juneau, Menlo Park, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/471,444

(22) Filed: Sep. 21, 2023

Related U.S. Application Data

(60) Continuation of application No. 18/072,572, filed on Nov. 30, 2022, now Pat. No. 11,799,449, which is a continuation of application No. 17/320,772, filed on May 14, 2021, now Pat. No. 11,545,959, which is a division of application No. 16/568,092, filed on Sep. 11, 2019, now Pat. No. 11,012,049, which is a division of application No. 15/985,622, filed on May 21, 2018, now Pat. No. 10,439,590, which is a division of application No. 15/595,486, filed on May 15, 2017, now Pat. No. 10,003,320, which is a division of application No. 14/940,069, filed on Nov. 12, 2015, now Pat. No. 9,667,223, which is a division of application No. 14/300,114, filed on Jun. 9, 2014, now Pat. No. 9,252,740, which is a division of application No. 13/561,862, filed on Jul. 30, 2012, now Pat. No. 8,749,315, which is a division of (Continued)

(51) Int. Cl.
*H03H 9/24* (2006.01)
*H03H 3/007* (2006.01)
*H03H 9/02* (2006.01)

(52) U.S. Cl.
CPC ........ *H03H 9/2405* (2013.01); *H03H 3/0072* (2013.01); *H03H 9/02259* (2013.01); *H03H 9/02433* (2013.01); *H03H 9/2457* (2013.01); *H03H 9/2468* (2013.01); *H03H 2009/02456* (2013.01); *H03H 2009/02496* (2013.01)

(58) Field of Classification Search
CPC ..... H03H 9/02; H03H 9/2457; H03H 9/02433
See application file for complete search history.

(56) References Cited

U.S. PATENT DOCUMENTS 6,985,051 B2    1/2006  Nguyen et al.
7,119,636 B2    10/2006 Nguyen et al.
(Continued)

*Primary Examiner* — Jeffrey M Shin

(57) ABSTRACT

A microelectromechanical system (MEMS) resonator includes a resonant semiconductor structure, drive electrode, sense electrode and electrically conductive shielding structure. The first drive electrode generates a time-varying electrostatic force that causes the resonant semiconductor structure to resonate mechanically, and the first sense electrode generates a timing signal in response to the mechanical resonance of the resonant semiconductor structure. The electrically conductive shielding structure is disposed between the first drive electrode and the first sense electrode to shield the first sense electrode from electric field lines emanating from the first drive electrode.

20 Claims, 17 Drawing Sheets

Related U.S. Application Data application No. 12/897,361, filed on Oct. 4, 2010, now Pat. No. 8,283,987, which is a division of application No. 12/054,300, filed on Mar. 24, 2008, now Pat. No. 7,808,332.

(60) Provisional application No. 60/970,233, filed on Sep. 5, 2007.

(56) References Cited

U.S. PATENT DOCUMENTS

| | | |
|---|---|---|
| 7,583,168 B2 | 9/2009 | Kawai et al. |
| 7,808,332 B1 * | 10/2010 | Pedersen ............ H03H 9/02259 333/197 |
| 8,283,987 B2 | 10/2012 | Pedersen et al. |
| 8,749,315 B2 | 6/2014 | Pedersen et al. |
| 9,252,740 B1 | 2/2016 | Pedersen et al. |
| 9,667,223 B1 | 5/2017 | Pedersen et al. |
| 10,003,320 B1 | 6/2018 | Pedersen et al. |
| 10,439,590 B1 | 10/2019 | Pedersen et al. |
| 11,012,049 B1 | 5/2021 | Pedersen et al. |
| 11,444,600 B1 | 9/2022 | Pedersen et al. |
| 11,545,959 B1 | 1/2023 | Pedersen et al. |
| 2004/0113722 A1 | 6/2004 | Bircumshaw et al. |
| 2004/0207492 A1 | 10/2004 | Nguyen et al. |
| 2011/0074247 A1 | 3/2011 | Hohlfeld et al. |

* cited by examiner

RESONATOR ELECTRODE SHIELDS

CROSS-REFERENCE TO RELATED APPLICATIONS

This application is a continuation of U.S. application Ser. No. 18/072,572, filed Nov. 30, 2022, which is continuation of U.S. application Ser. No. 17/320,772, filed May 14, 2021 (now U.S. Pat. No. 11,545,959), which is a divisional of U.S. application Ser. No. 16/568,092, filed Sep. 11, 2019 (now U.S. Pat. No. 11,012,049), which is a divisional of U.S. application Ser. No. 15/985,622, filed May 21, 2018 (now U.S. Pat. No. 10,439,590), which is a divisional of U.S. application Ser. No. 15/595,486, filed May 15, 2017 (now U.S. Pat. No. 10,003,320), which is a divisional of U.S. application Ser. No. 14/940,069, filed Nov. 12, 2015 (now U.S. Pat. No. 9,667,223), which is a divisional of U.S. application Ser. No. 14/300,114, filed Jun. 9, 2014 (now U.S. Pat. No. 9,252,740), which is a divisional of U.S. application Ser. No. 13/561,862, filed Jul. 30, 2012 (now U.S. Pat. No. 8,749,315), which is a divisional of U.S. application Ser. No. 12/897,361, filed Oct. 4, 2010 (now U.S. Pat. No. 8,283,987), which is a divisional of U.S. application Ser. No. 12/054,300, filed Mar. 24, 2008 (now U.S. Pat. No. 7,808,332), which claims benefit of U.S. Provisional Application No. 60/970,233, filed Sep. 5, 2007. Each of the above-referenced patent applications is hereby incorporated by reference in its entirety.

TECHNICAL FIELD

This application relates generally to microelectromechanical systems (MEMS) and, more specifically, to resonator electrode shields that are configured to reduce interfering signals.

BACKGROUND

Microelectromechanical system (MEMS) devices are currently being developed for a wide variety of applications. One such device is a MEMS resonator, which can be used in the timing circuitry of electronic devices to generate a timing signal. MEMS resonator systems typically include one or more electrodes that drive the motion of a MEMS resonator (referred to herein as "drive electrodes"). As is well-known, when a voltage is applied to a drive electrode, a charge accumulates on the electrode that applies an electrostatic force between the electrode and an opposite charge built up on the MEMS resonator structure. By applying a time-varying voltage signal to the drive electrode, often in combination with a DC voltage, a time-varying electrostatic force can be generated that capacitively couples mechanical energy to the active elements of the MEMS resonator structure, causing the active elements to resonate (the term "active elements" is defined herein to be the one or more elements of the MEMS resonator structure whose motion causes the MEMS resonator to generate the desired timing signal). In addition one or more sense electrodes generate or conduct a time-varying current as a result of capacitive coupling between the moving active elements of the MEMS resonator structure and the sense electrodes. Ultimately, the timing signal is extracted from the time-varying current conducted by the sense electrodes. The sense and drive electrodes do not need to be paired. For example, the number of sense and drive electrodes may differ, or the electrodes may be used for both sense and drive. Alternatively, the active elements can be used as the drive or sense electrodes.

The desired capacitive coupling from the drive electrodes to the active elements of the MEMS resonator structure to the sense electrodes may be accompanied by additional coupling from drive to sense electrodes directly or through other elements of the MEMS resonator system. These signal paths may create interfering signals that can compromise the overall integrity of the generated timing signal.

One kind of an interfering signal, referred to herein as an "induced current," can arise when time-varying voltage signals applied to the drive electrodes cause time-varying currents to be induced within one or more non-active elements of the MEMS resonator, support, or other structures (i.e., elements not responsible for generating the desired timing signal such as the elements that provide structural support for the MEMS resonator system). These induced currents can alter the voltage on the MEMS resonator structure, which can capacitively couple to the sense electrodes. For example, when current is induced in support structures, these currents can cause voltages to be impressed on the resonator structures. The changing voltage on the resonator relative to the sense electrodes can induce a sense current.

A second kind of an interfering signal, referred to herein as a "feed-through current," can arise when the one or more drive electrodes couple capacitively directly to the one or more sense electrodes. In such a case a capacitively coupled signal can traverse past the resonator structure from drive to sense independently of the mechanical motion of the resonator.

Yet another kind of a interfering signal, referred to herein as a "spurious resonance current," can arise due to the mechanical motion of non-active elements of the MEMS resonator structure. Such non-active elements may include support or auxiliary elements within the overall MEMS resonator system. An electrostatic force from one or more drive electrodes can cause one or more non-active elements, such as isolating springs, to move or resonate. The mechanical motion may be transduced by a nearby sense electrode, causing the sense electrode to conduct additional current, separate from the desired current produced in response to the desired motion of the active elements of the MEMS resonator structure.

There is additionally a form of spurious resonance current that can be caused from an undesired forcing of a resonant structure that excites an undesired mechanical mode. This differs from the previously described spurious resonance in that it can be in the primary resonance structure rather than, for instance, a support or an isolation spring. To avoid this, the resonant structure in some cases must have a carefully controlled forcing and sensing geometry to assure that it only is excited in a desired mode.

These spurious currents can decrease the signal quality of the oscillator that is built with the MEMS resonator. This can occur in various ways that are particular to the type or cause of the currents. The descriptions below are examples and are not to be understood as exhaustive cases.

One consequence of the interfering currents can be reduced signal to noise ratio (SNR) of an oscillator built with the MEMS resonator. The interfering currents can increase the electrical noise in the MEMS resonator system since they are not from the intended motion of the active elements of the MEMS resonator structure.

Another consequence of interfering currents is decreased stability of the output frequency of an oscillator built with the MEMS resonator. The interfering currents can shift the phase of the MEMS resonator or sustaining circuit and shift the frequency of the oscillator. For example, feed-through current is normally 90° out of phase with the MEMS on-peak resonance current. When these currents are summed the aggregate current is not in phase at the MEMS resonance peak. The oscillation criteria can then only be satisfied if the circuitry's or the resonator's phase is shifted. This shift can change with temperature or time and thereby affect the frequency stability.

Another consequence of interfering currents is that they may be large enough to cause the overall oscillator to lock onto an undesirable resonant mode at an undesired frequency. For example, spurious currents can excite an undesired resonance in a support or isolation structure that can be mistaken for the desired resonance.

One way to minimize the interfering signals described herein is through differential cancellation, where differential drive electrodes are configured to apply opposite charges on the MEMS resonator structure, and/or differential sense electrodes are configured to reject common-mode coupled currents. However, not all electrodes and not all mechanical arrangements can be configured for differential signaling. In addition, there may be situations when one polarity of the differential drive and/or sense electrodes couple more strongly to the resonator structure than the other polarity. This can occur for instance when the electrodes are not fully symmetrical. In such situation differential cancellation may not be effective or may not be as effective as desired.

Another way to minimize interfering signals, particularly in the case of induced current is to decrease the induced voltage on the MEMS resonator by decreasing the structural impedance between the MEMS resonator and either the bias or ground. Such an approach may be implemented with carefully designed electrical contacts, by increasing the doping within the MEMS resonator structure, and/or modifying the mechanical design of the MEMS resonator system. However, limitations on electrode design, the mechanical and fabrication issues associated with achieving high doping levels within the MEMS resonator structure, and/or the mechanical constraints on the design place a limit on how much the overall impedance may be decreased.

As the foregoing illustrates, what is needed in the art is a different way to decrease the adverse effects of interfering signals in a MEMS resonator system.

SUMMARY OF ONE OF MULTIPLE DISCLOSED EMBODIMENTS

One embodiment of the present invention sets forth a system for generating a timing signal. The system includes a micro-electromechanical system (MEMS) resonator having a first non-active element, a first active element, and a second active element, where, in operation, the first active element and the second active element are configured to resonate. The system also includes a first drive electrode configured to receive a first time-varying signal that causes the first active element to resonate, a first sense electrode configured to conduct a second time-varying signal in response to the motion of the second active element, and a first resonator electrode shield configured to reduce an interfering signal associated with the first non-active element.

One advantage of the disclosed system is that, among other things, the resonator electrode shield reduces undesired capacitive coupling between the resonator electrodes and the non-active elements of the MEMS resonator. As a result, the deleterious effects of interfering signals may be mitigated, enabling the disclosed systems to produce higher quality timing signals in a manner that is simpler and more efficient relative to prior art approaches. A second advantage is a reduction in feed-through current.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
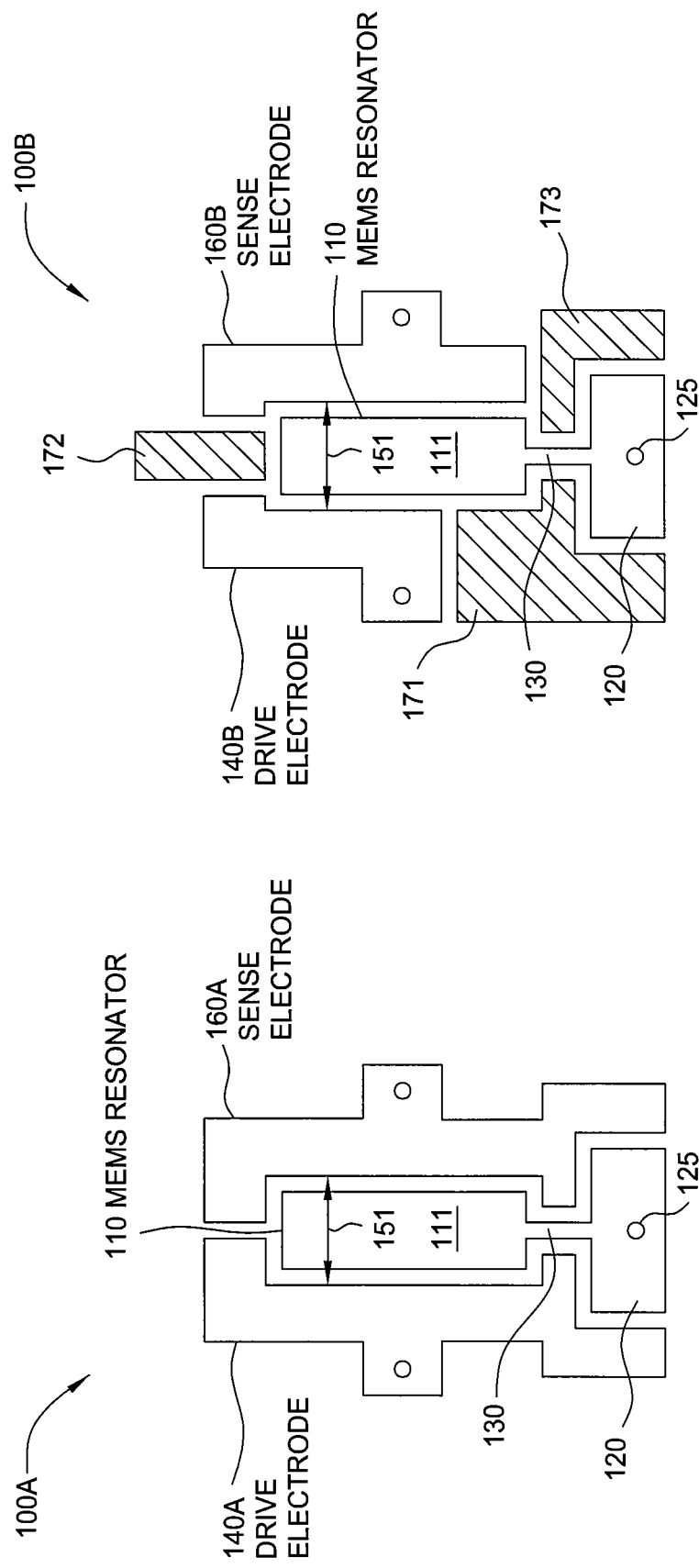
FIG. 1A illustrates a MEMS resonator system without resonator electrode shields, according to prior art.
FIG. 1B illustrates a MEMS resonator system with resonator electrode shields, according to one embodiment of the present invention.

FIG. 1A illustrates a MEMS resonator system 100A without resonator electrode shields, according to prior art. As shown, the MEMS resonator system 100A includes a MEMS resonator 110, a drive electrode 140A, and a sense electrode 160A. The MEMS resonator further includes a MEMS resonator beam 111, a support element 120, and a flexure element 130. The MEMS resonator beam 111 is referred to herein as an "active element" of the MEMS resonator 110 because the motion of the MEMS resonator beam 111 ultimately leads to the generation of the desired timing signal in the MEMS resonator system 100A. The support element 120 and the flexure element 130 are referred to herein as "non-active elements" of the MEMS resonator 110 because these elements are not supposed to be driven by the drive electrode 140A and, therefore, should not contribute to the timing signal produced by the MEMS resonator system 100A. The support element 120 is configured to provide an anchor 125 for the MEMS resonator 110 as well as mechanical support for the MEMS resonator beam 111. The flexure element 130 is an auxiliary element configured to allow the MEMS resonator beam 111 to resonate.

The drive electrode 140A may cause the MEMS resonator beam 111 to resonate in the direction indicated by arrow 151. In response, the sense electrode 160A may generate or conduct a time-varying current as a result of capacitive coupling between the MEMS resonator beam 111 and the sense electrode 160A. Ultimately, the timing signal may be extracted from the time-varying current conducted by the sense electrode 160A.

The desired capacitive coupling from the drive electrode 140A to the MEMS resonator beam 111 may be accompanied by additional coupling from the drive electrode 140A to the sense electrode 160A either directly or through other elements of the MEMS resonator system 100A. As previously descried herein, these signal paths may create induced currents, feed-through currents, and spurious resonance currents that compromise the overall integrity of the generated timing signal.

FIG. 1B illustrates a MEMS resonator system 100B with resonator electrode shields 171, 172, and 173, according to one embodiment of the present invention. Similarly to the MEMS resonator system 100A, the MEMS resonator system 100B includes a MEMS resonator 110, a drive electrode 140B, and a sense electrode 160B. As shown, the resonator electrode shield 171 is disposed between the non-active elements of the MEMS resonator 110 and the drive electrode 140B, the resonator electrode shield 172 is disposed between the drive electrode 140B and the sense electrode 160B, and the resonator electrode shield 173 is disposed between the non-active elements of the MEMS resonator 110 and the sense electrode 160B. In one embodiment, the resonator electrode shields 171-173 are fabricated from a conductive material, such as, for example, doped silicon. As a result, the electric field line between the non-active elements of the MEMS resonator 110 and the resonator electrodes are terminated at the resonator electrode shields 171 and 173, preventing or reducing capacitive coupling between the resonator electrodes on one side of the electrode shields and the non-active elements of the MEMS resonator 110 on the other side. In addition, the resonator electrode shield 172 prevents or reduces capacitive coupling between the drive electrode 140B and the sense electrode 160B. Arranging the resonator electrode shields 171-173 in this fashion ensures that the drive electrode 140B and the sense electrode 160B interact with only the active element of the MEMS resonator 110 and are "shielded" from capacitively coupling to the non-active elements of the MEMS resonator 110 and to each other.

Placing the resonator electrode shields 171-173 between the non-active elements of the MEMS resonator 110, the drive electrode 140B, and the sense electrode 160B acts to decrease or prevent the interfering signals previously described herein. For example, without the resonator electrode shield 171, the time-varying voltage signal applied to the drive electrode 140B could cause time-varying currents to be induced within the support element 120 and/or the flexure element 130. As previously described, these induced currents could alter the voltage on the MEMS resonator 110. In turn, changing the voltage on the MEMS resonator 110 relative to the sense electrode 160B could induce a current in the sense electrode 160B, separate from the desired current produced in response to the desired motion of the active elements of the MEMS resonator 110. However, since the resonator electrode shield 171 terminates the electric field lines between the drive electrode 140B and the non-active elements of the MEMS resonator 110, the induced currents within the support element 120 and/or flexure element 130 are reduced or prevented, thereby preserving the constant voltage on the MEMS resonator 110.

In addition, since the sense electrode 160B is located in close proximity to the drive electrode 140B, without the resonator electrode shield 172, the drive electrode 140B could capacitively couple directly to the sense electrode 160B. Consequently, the sense electrode 160B could conduct not only the time-varying current based on the motion of the MEMS resonator beam 111, but could also conduct a feed-through current traversed past the MEMS resonator 110 to the sense electrode 160B independently of the mechanical motion of the MEMS resonator beam 111. However, the resonator electrode shield 172 terminates the electric field lines between the drive electrode 140B and the sense electrode 160B, thereby preventing or reducing the generation of feed-through current. In addition, placement of the resonator electrode shields 171-173 may impact the tendency of the MEMS resonator 110 to resonate in unwanted modes (i.e., help to shape the force driving the modes). For example, in FIG. 1B, the portion of the resonator electrode shield 171 that extends up to cover the bottom main portion of the MEMS resonator beam 111 will inhibit or partially inhibit the driving force on the pure side to side resonant mode while encouraging the preferred pendulum type resonant mode.

Furthermore, during the operation of the MEMS resonator system 100B, the motion of the MEMS resonator beam 111 oftentimes cause both the support element 120 and the flexure element 130 to resonate. Without the resonator electrode shield 173, the motion of these non-active elements could be detected by the nearby sense electrode 160B, causing the sense electrode 160B to conduct additional spurious resonance current, as previously described herein. However, placing the resonator electrode shield 173 between the sense electrode 160B and the non-active elements of the MEMS resonator 110 prevents or reduces any capacitive coupling between the resonating non-active elements and the sense electrode 160B and, therefore, prevents or reduces the generation of the spurious resonance current in the sense electrode 160B. In addition, reducing the length of the drive electrode 140B so that the drive electrode 140B does not extend all the way to the non-active elements of the MEMS resonator 110, and extending the resonator electrode shield 171, may reduce the motion of the support element 120 and the flexure element 130. As a result, reduced motion may be transduced by the sense electrode 160B, diminishing or eliminating the spurious resonance currents.

Figure 2:
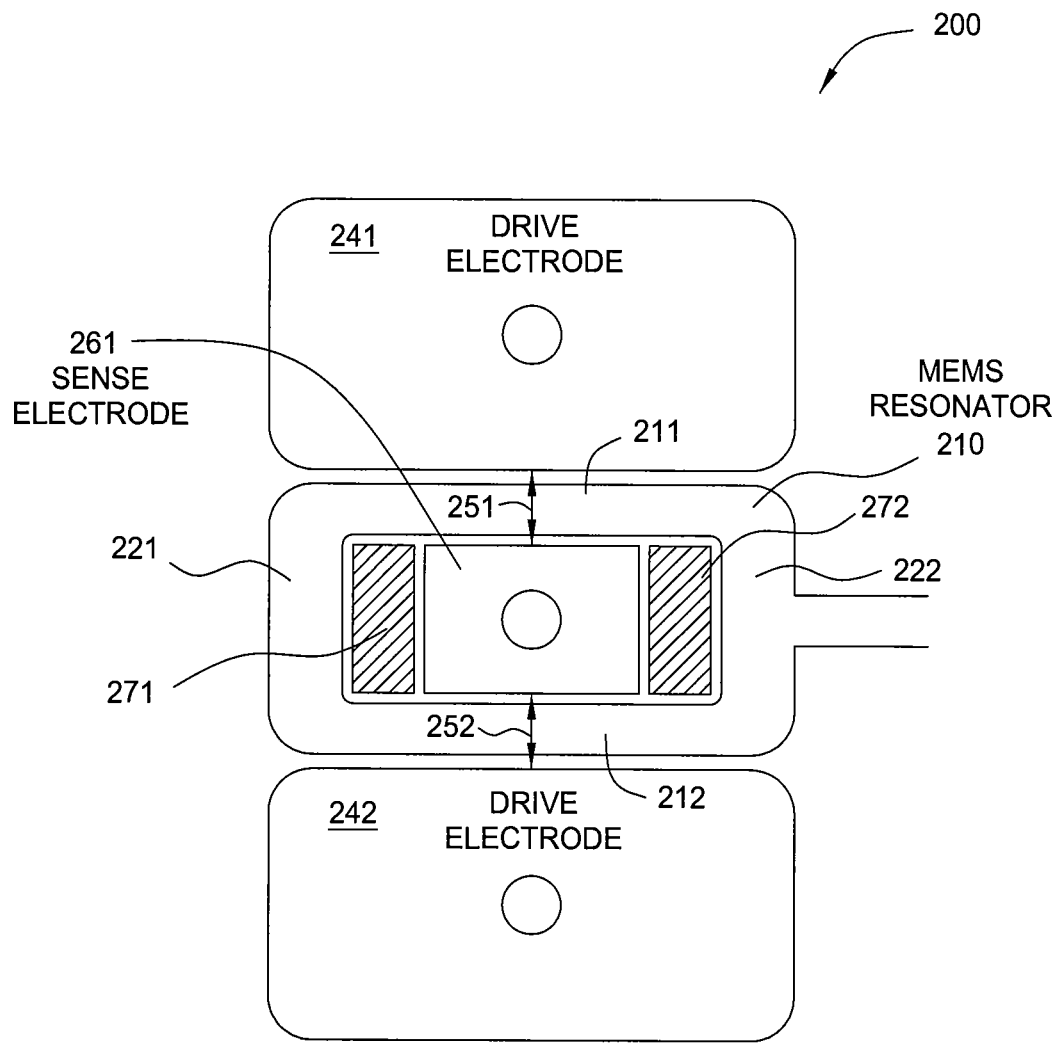
FIG. 2 illustrates resonator electrode shields implemented with a tuning fork-configured MEMS resonator system, according to another embodiment of the present invention.

FIG. 2 illustrates resonator electrode shields 271 and 272 implemented with a tuning fork-configured MEMS resonator system 200, according to another embodiment of the present invention. As shown, the MEMS resonator system 200 includes, without limitation, a MEMS resonator 210, drive electrodes 241 and 242, and a sense electrode 261. The MEMS resonator 210 further includes MEMS resonator beams 211 and 212, a left element 221, and a right element 222. In this configuration, the MEMS resonator beams 211 and 212 are referred the "active elements" of the MEMS resonator 210 because their motion ultimately leads to the generation of the desired timing signal in the MEMS resonator system 200. The left element 221 and the right element 222 are the "non-active elements" of the MEMS resonator 210 because these elements are structural elements that are not supposed to contribute to the timing signal produced by the MEMS resonator system 200.

In operation, the drive electrodes 241 and 242 cause the MEMS resonator beams 211 and 212 to resonate in the directions indicated by arrows 251 and 252, respectively. The sense electrode 261 is paired to both of the drive electrodes 241 and 242 and is located such that the MEMS resonator beam 211 is disposed between the sense electrode 261 and drive electrode 241, and the MEMS resonator beam 212 is disposed between the sense electrode 261 and drive electrode 242. The sense electrode 261 is configured to conduct a time-varying current resulting from the capacitive coupling that occurs between the MEMS resonator beams 211 and 212 as the MEMS resonator beams resonate.

As also shown, the MEMS resonator system 200 includes the resonator electrode shields 271 and 272 disposed between the non-active elements of the MEMS resonator 210 and the sense electrode 261. Similar to the resonator electrode shields 171-173 of FIG. 1B, the resonator electrodes 271 and 272 are fabricated from a conductive material (e.g., doped silicon). Arranging the resonator electrode shields 271 and 272 in this fashion ensures that the sense electrode 261 interacts with only the MEMS resonator beams 211 and 212 and is "shielded" from capacitively coupling to the left element 221 and the right element 222.

Again, placing the resonator electrode shields 271 and 272 between the non-active elements of the MEMS resonator 210 and the sense electrode 261 acts to prevent or reduce the interfering signals previously described herein. For example, the time-varying voltage signal applied to the drive electrodes 241 and 242 could cause time-varying currents to be induced within the left element 221 and the right element 222 of the MEMS resonator 210. Since the sense electrode 261 is located in close proximity to the left element 221 and the right element 222, without the resonator electrode shields 271 and 272, the time-varying induced currents within the left element 221 and the right element 222 could be "sensed" by the sense electrode 261. In such a case, the sense electrode 261 could conduct an additional current based on the induced currents in the non-active elements of the MEMS resonator 210, separate from the desired current produced in response to the desired motion of the MEMS resonator beams 211 and 212. However, the resonator electrode shields 271 and 272 prevent or reduce the sense electrode 261 from "sensing" the currents induced within the non-active elements.

Furthermore, during the operation of the MEMS resonator system 200, the motion of the MEMS resonator beams 211 and 212 could cause the left element 221 and the right element 222 to resonate. Without the resonator electrode shields 271 and 272, the motion of these non-active elements could be detected by the sense electrode 261, causing the sense electrode 261 to conduct spurious resonance currents, as previously described herein. However, placing the resonator electrode shields 271 and 272 between the sense electrode 261 and left element 221 and the right element 222 prevents or reduces any capacitive coupling between the resonating non-active elements and the sense electrode 261 and, therefore, prevents or reduces the generation of the spurious resonance currents in the sense electrode 261.

Figure 3A:
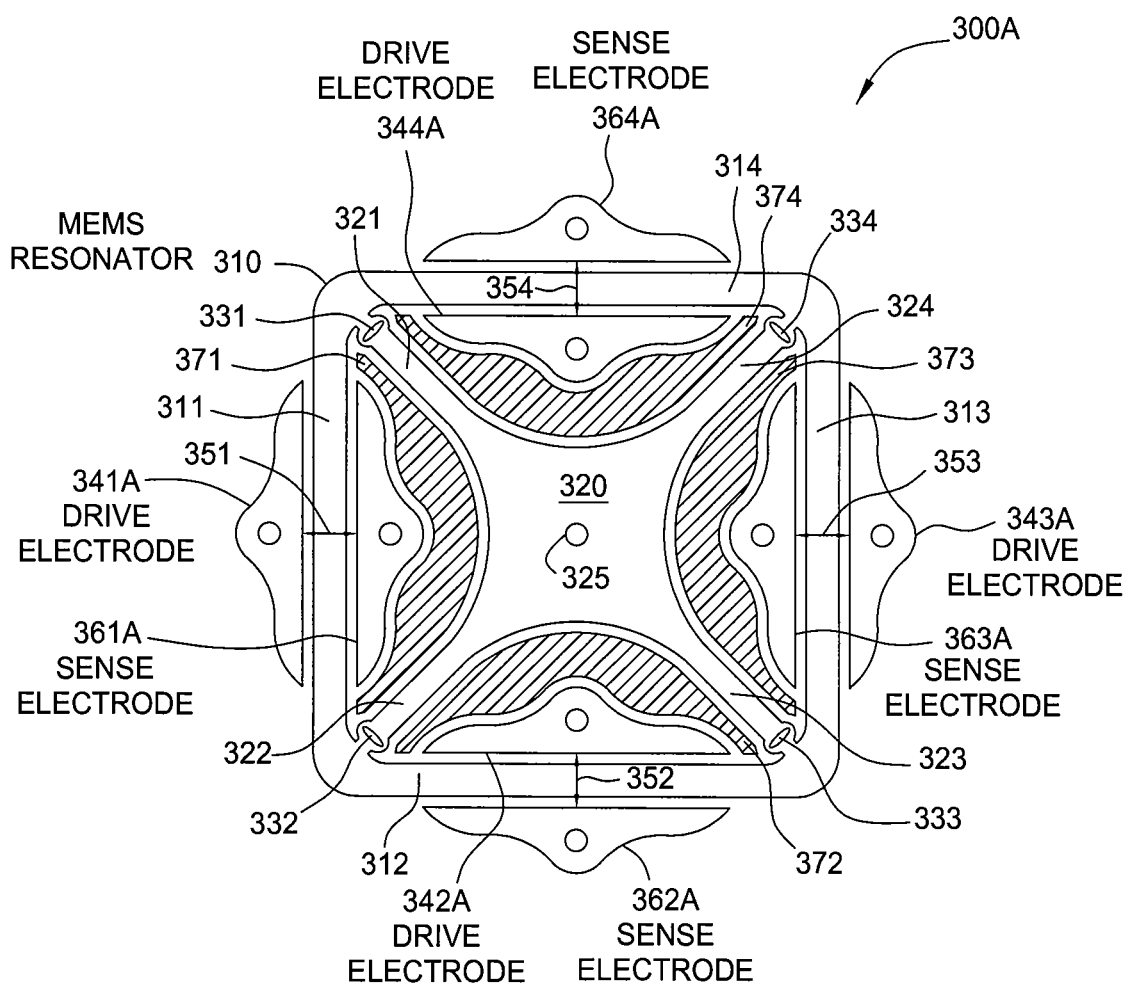
FIGS. 3A-3E illustrate resonator electrode shields implemented with a quad-configured MEMS resonator system, according to different embodiments of the present invention.

FIG. 3A illustrates resonator electrode shields 371-374 implemented with a quad-configured MEMS resonator system 300A, according to one embodiment of the present invention. As shown, the MEMS resonator system 300A includes, without limitation, a MEMS resonator 310 and a number of drive electrodes 341A-344A and sense electrodes 361A-364A, disposed in different locations relative to the MEMS resonator 310. The sense electrodes 361A and 363A and the drive electrodes 342A and 344A are located inside the MEMS resonator 310. The sense electrodes 362A and 364A and the drive electrodes 341A and 343A are located outside the MEMS resonator 310.

The MEMS resonator 310 further includes MEMS resonator beams 311-314, a support element 320 that includes support arms 321-324, and isolating spring elements 331-334. The MEMS resonator beams 311-314 are referred to herein as "active elements" of the MEMS resonator 310 because their motion ultimately leads to the generation of the desired timing signal in the MEMS resonator system 300A. The support element 320 and the isolating spring elements 331-334 are referred to herein as "non-active elements" of the MEMS resonator 310 because these elements are not supposed to be driven by the drive electrodes 341A-344A and, therefore, should not contribute to the timing signal produced by the MEMS resonator system 300A. The support element 320 is configured to provide an anchor 325 for the MEMS resonator 310 as well as mechanical support for the MEMS resonator beams 311-314. The isolating spring elements 331-334 are auxiliary elements that are configured to minimize the stress on the support arms 321-324 of the support element 320 caused by the motion of the MEMS resonator beams 311-314.

The drive electrode 341A causes the MEMS resonator beam 311 to oscillate in the direction indicated by arrow 351. Similarly, the drive electrode 342A causes the MEMS resonator beam 312 to oscillate in the direction indicated by arrow 352, the drive electrode 343A causes the MEMS resonator beam 313 to oscillate in the direction indicated by arrow 353, and the drive electrode 344A causes the MEMS resonator beam 314 to oscillate in the direction indicated by arrow 354. In this configuration, for each of the drive electrodes 341A-344A, there is a paired sense electrode 361A-364A, respectively, arranged such that one of the MEMS resonator beams 311-314 is disposed between the drive electrode and sense electrode of each electrode pair. In operation, each sense electrode is configured to conduct a time-varying current resulting from the capacitive coupling that occurs between the MEMS resonator beam, disposed between each electrode pair, and the sense electrode of that pair as the MEMS resonator beam oscillates. Persons skilled in the art will recognize that, in various embodiments, the drive and sense electrodes do not necessarily need to be paired. In general, each of the drive electrodes 341A-344A may comprise M drive electrodes, and each of the sense electrodes 361A-364A may comprise N sense electrodes. In such a configuration, each of the MEMS resonator beams 311-314 may be disposed between M drive electrodes and N sense electrodes, where the M drive electrodes cause the MEMS resonator beam to oscillate, while the N sense electrodes conduct a time-varying current resulting from the capacitive coupling between the MEMS resonator beam and the sense electrodes.

As also shown, the MEMS resonator system 300A includes the resonator electrode shields 371-374 disposed between the non-active elements of the MEMS resonator 310 and the resonator electrodes located within the MEMS resonator 310. As shown, the resonator electrode shield 371 is disposed between the sense electrode 361A on one side and the support element 320 and the isolating spring elements 331 and 332 on the other side. Similarly, the resonator electrode shield 372 is disposed between the drive electrode 342A on one side and the support element 320 and the isolating spring elements 332 and 333 on the other side. The resonator electrode shield 373 is disposed between the sense electrode 363A on one side and the support element 320 and the isolating spring elements 333 and 334 on the other side. Finally, the resonator electrode shield 374 is disposed between the drive electrode 344A on one side and the support element 320 and the isolating spring elements 334 and 331 on the other side. Similar to FIGS. 1B and 2, in one embodiment, the resonator electrode shields 371-374 are fabricated from a conductive material (e.g., doped silicon). As a result, the electric field lines between the non-active elements of the MEMS resonator 310 and the resonator electrodes located inside the MEMS resonator 310 are terminated at the resonator electrode shields 371-374, preventing capacitive coupling between the resonator electrodes on one side of the electrode shields and the non-active elements of the MEMS resonator 310 on the other side. Arranging the resonator electrode shields 371-374 in this fashion ensures that the drive electrodes 342A and 344A and the sense electrodes 361A and 363A interact with only the active elements of the MEMS resonator 310 corresponding to these electrodes and are "shielded" from capacitively coupling to the non-active elements of the MEMS resonator 310.

Again, placing the resonator electrode shields 371-374 between the non-active elements of the MEMS resonator 310 and the resonator electrodes located within the MEMS resonator 310 acts to prevent the interfering signals previously described herein. For example, without the resonator electrode shields 372 and 374, the time-varying voltage signal applied to the drive electrodes 342A and 344A could cause time-varying currents to be induced within the support arms 321-324 of the MEMS resonator 310. As previously described, these induced currents could alter the voltage on the MEMS resonator 310, which may change the magnitude of the electrostatic forces between the MEMS resonator beams 312 and 314 and the drive electrodes 342A and 344A, thereby negatively impacting the generated timing signal. However, since the resonator electrode shields 372 and 374 terminate the electric field lines from the drive electrodes 342A and 344A, the induced currents within the support arms 321-324 are prevented, thereby preserving the constant voltage on the MEMS resonator 310.

In addition, since the sense electrodes 361A and 363A are located in close proximity to the support arms 321-324, without the resonator electrode shields 371-374, the time-varying induced currents within the support arms 321-324 could be "sensed" by the sense electrodes 361A and 363A. Consequently, the sense electrodes 361A and 363A could conduct not only the time-varying current based on the motion of the MEMS resonator beams 311 and 313, respectively, but could also conduct an additional current based on the induced current within the support arms 321-324 caused by the unpaired drive electrodes 342A and 344A. However, since the resonator electrode shields 372 and 374 prevent the induced currents within the support arms 321-324, the shields also prevent the generation of the additional currents based on the induced currents in the non-active elements.

Furthermore, during the operation of the MEMS resonator system 300A, the oscillations of the MEMS resonator beams 311-314 oftentimes cause both the support arms 321-324 and the isolating spring elements 331-334 to vibrate. Without the resonator electrode shields 371 and 373, the mechanical vibrations of these non-active elements could be transduced by the nearby sense electrodes 361A and 363A, causing the sense electrodes 361A and 363A to conduct spurious resonance currents, as previously described herein. However, placing the resonator electrode shields 371 and 373 between the sense electrodes 361A and 363A and the non-active elements of the MEMS resonator 310 prevents any capacitive coupling between the vibrating non-active elements and the sense electrodes and, therefore, prevents the generation of spurious resonance currents in the sense electrodes 361A and 363A.

Figure 3B:
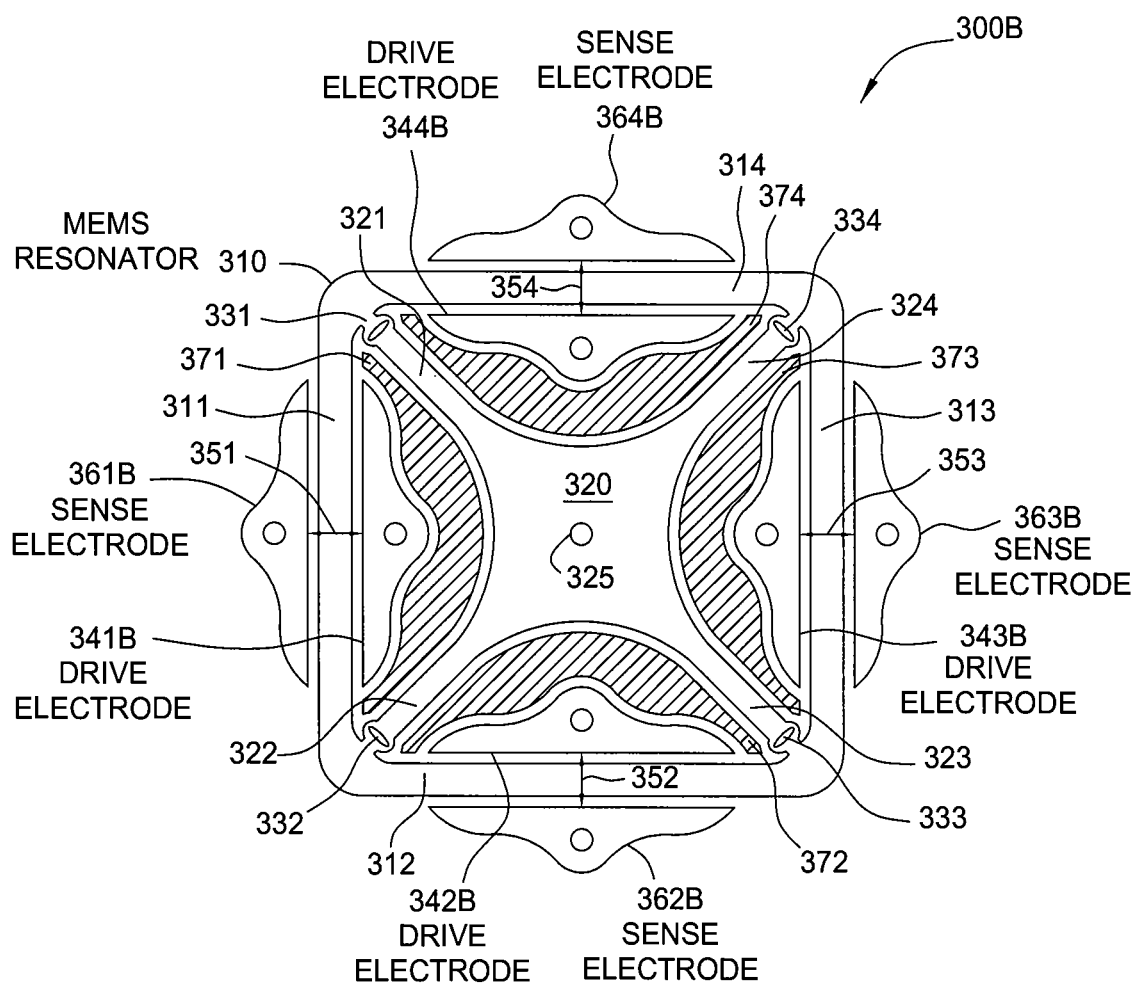

FIG. 3B illustrates resonator electrode shields 371-374 implemented with a quad-configured MEMS resonator system 300B, according to another embodiment of the present invention. The MEMS resonator system 300B differs from the MEMS resonator system 300A by the locations of drive electrodes 341B-344B and sense electrodes 361B-364B relative to the MEMS resonator 310. Similar to the explanation associated with FIG. 3A, in various embodiments, the drive and sense electrodes do not necessarily need to be paired. In general, each of the drive electrode 341B-344B may comprise M drive electrodes, and each of the sense electrodes 361B-364B may comprise N sense electrodes. Again, in such a configuration, each of the MEMS resonator beams 311-314 may be disposed between M drive electrodes and N sense electrodes, where the M drive electrodes cause the MEMS resonator beam to oscillate, while the N sense electrodes conduct a time-varying current resulting from the capacitive coupling between the MEMS resonator beam and the sense electrodes.

As shown, in the embodiment of FIG. 3B, all of the sense electrodes 361B-364B are disposed outside the MEMS resonator 310 and all of the drive electrodes 341B-344B are disposed inside the MEMS resonator 310. Persons skilled in the art will recognize that the location of the resonator electrodes relative to the MEMS resonator 310 affects which types of interfering signals are generated within the system. Here, since the sense electrodes 361B-364B are located outside of the MEMS resonator 310, the mechanical vibrations of non-active elements within the MEMS resonator 310 generally do not cause the sense electrodes 361B-364B to conduct spurious resonance currents.

However, since the time-varying voltage signal applied to all of the drive electrodes 341B-344B could cause electrical currents to be induced within the support arms 321-324 of the MEMS resonator 310, these induced currents could alter the voltage on the MEMS resonator 310. Altered voltages on the active elements of the MEMS resonator 310 could, in turn, capacitively induce additional currents in the sense electrodes 361B-364B. As a result, the sense electrodes 361B-364B not only could conduct the time-varying current based on the desired motion of the MEMS resonator beams 311-314, but also could conduct an additional current based on the induced current within the support arms 321-324 caused by the drive electrodes 341B-344B. Similar to FIG. 3A, the resonator electrode shields 371-374 terminate the electric field lines from the drive electrodes 341B-344B, thereby preventing the induced currents within the support arms 321-324. Consequently, the desired constant voltage on the MEMS resonator 310 may be preserved, preventing the generation of additional currents in the sense electrodes 361B-364B based on the induced currents in the non-active elements.

Figure 3C:
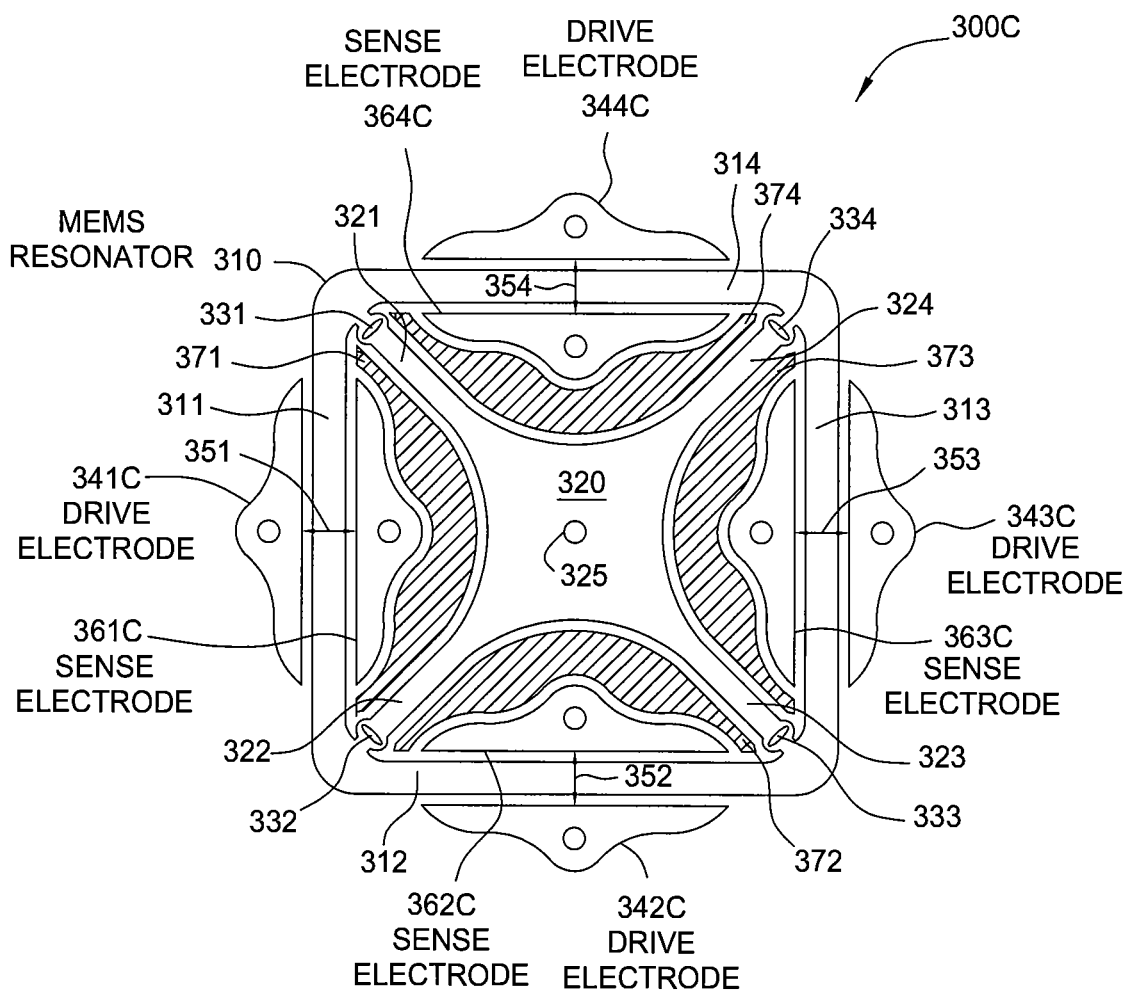

FIG. 3C illustrates resonator electrode shields 371-374 implemented with a quad-configured MEMS resonator system 300C, according to another embodiment of the present invention. Again, the MEMS resonator system 300C differs from the MEMS resonator systems 300A and 300B by the locations of drive electrodes 341C-344C and sense electrodes 361C-364C relative to the MEMS resonator 310. Similar to the explanation associated with FIG. 3A, in various embodiments, the drive and sense electrodes do not necessarily need to be paired. In general, each of the drive electrode 341C-344C may comprise M drive electrodes, and each of the sense electrodes 361C-364C may comprise N sense electrodes. Again, in such a configuration, each of the MEMS resonator beams 311-314 may be disposed between M drive electrodes and N sense electrodes, where the M drive electrodes cause the MEMS resonator beam to oscillate, while the N sense electrodes conduct a time-varying current resulting from the capacitive coupling between the MEMS resonator beam and the sense electrodes.

As shown, in this embodiment, all of the sense electrodes 361C-364C are disposed inside the MEMS resonator 310, and all of the drive electrodes 341C-344C are disposed outside the MEMS resonator 310. Again, the location of the resonator electrodes relative to the MEMS resonator 310 affects which of the interfering signals are generated within the system. Here, even though the drive electrodes 341C-344C are located outside of the MEMS resonator 310, the drive electrodes may still cause time-varying currents to be induced within the support arms 321-324 by capacitively coupling to the outer edges of the support arms 321-324. Further, since the sense electrodes 361C-364C are located in close proximity to the support arms 321-324, without the resonator electrode shields 371-374, the time-varying induced currents within the support arms 321-324 could be "sensed" by the sense electrodes 361C-364C. Consequently, the sense electrodes 361C-364C not only could conduct the time-varying current based on the motion of the MEMS resonator beams 311-314, but also could conduct an additional current based on the induced current within the support arms 321-324 caused by the drive electrodes 341C-344C. The resonator electrode shields 371-374 terminate the electric field lines from the support arms 321-324, thereby preventing the generation of the additional currents based on the induced currents in the non-active elements.

In addition, similar to FIG. 3A, during the operation of the MEMS resonator system 300C, the oscillations of the MEMS resonator beams 311-314 oftentimes cause both the support arms 321-324 and the isolating spring elements 331-334 to vibrate. The mechanical vibrations of these non-active elements of the MEMS resonator could be detected by the nearby sense electrodes 361C-364C, causing the sense electrodes 361C-364C to conduct spurious resonance currents, as previously described herein. Placing the resonator electrode shields 371-374 between the sense electrodes 361C-364C and the non-active elements of the MEMS resonator 310 prevents any capacitive coupling between the vibrating non-active elements and the sense electrodes and, therefore, prevents the generation of spurious resonance currents in the sense electrodes 361C-364C.

Figure 3D:
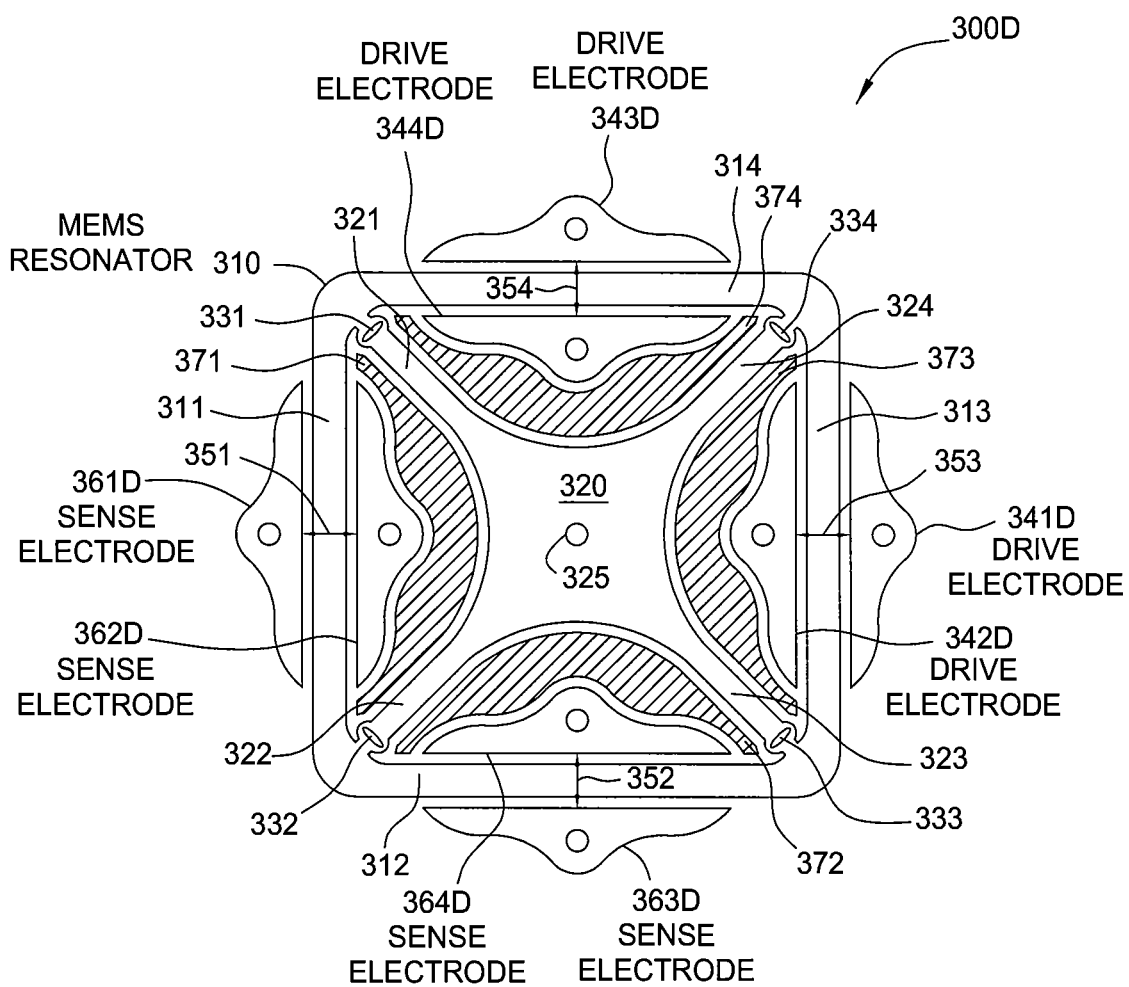

FIG. 3D illustrates resonator electrode shields 371-374 implemented with a quad-configured MEMS resonator system 300D, according to another embodiment of the present invention. Again, the MEMS resonator system 300D differs from the MEMS resonator systems 300A-300C by the locations of drive electrodes 341D-344D and sense electrodes 361D-364D relative to the MEMS resonator 310. In this embodiment, the drive electrodes 341D-344D and the sense electrodes 361D-364D are differentially coupled. Thus, the sense electrodes 361D and 362D are disposed on opposite sides of the MEMS resonator beam 311, with one of the sense electrodes 361D and 362D being the positive electrode, and the other electrode being the negative electrode. The sense electrodes 363D and 364D are disposed on the opposite sides of the MEMS resonator beam 312, with one of the sense electrodes 363D and 364D being the positive electrode, and the other electrode being the negative electrode. The drive electrodes 341D and 342D are disposed on the opposite sides of the MEMS resonator beam 313, with one of the drive electrodes 341D and 342D being the positive electrode, and the other electrode being the negative electrode. Finally, the drive electrodes 343D and 344D are disposed on the opposite sides of the MEMS resonator beam 314, with one of the drive electrodes 343D and 344D being the positive electrode, and the other electrode being the negative electrode.

In various embodiments, each of the drive electrode 341D-344D may comprise any technically feasible number of drive electrodes, and each of the sense electrodes 361D-364D may comprise any technically feasible number of sense electrodes. In such configurations, each of the MEMS resonator beams 311-314 may be disposed between M electrodes on one side and N electrodes on the other side.

Again, placing the resonator electrode shields 371-374 between the non-active elements of the MEMS resonator 310 and the resonator electrodes located within the MEMS resonator 310 acts to prevent the interfering signals previously described herein. For example, without the resonator electrode shields 373 and 374, the time-varying voltage signal applied to the drive electrodes 341D-344D could cause time-varying currents to be induced within the support arms 321-324 of the MEMS resonator 310. As previously described, these induced currents could alter the voltage on the MEMS resonator 310, which may change the magnitude of the electrostatic forces between the MEMS resonator beams 313 and 314 and the drive electrodes 341D-344D, thereby negatively impacting the generated timing signal. However, since the resonator electrode shields 373 and 374 terminate the electric field lines from the drive electrodes 341D-344D, the induced currents within the support arms 321-324 are prevented, thereby preserving the constant voltage on the MEMS resonator 310.

In addition, since the sense electrodes 361D-364D are located in close proximity to the support arms 321-324, without the resonator electrode shields 371-374, the time-varying induced currents within the support arms 321-324 could be "sensed" by the sense electrodes 361D-364D. Consequently, the sense electrodes 361D-364D could conduct not only the time-varying current based on the motion of the MEMS resonator beams 311 and 312, but could also conduct an additional current based on the induced current within the support arms 321-324 caused by the drive electrodes 341D-344D. Again, since the resonator electrode shields 373 and 374 prevent the induced currents within the support arms 321-324, and the resonator electrode shields 371 and 372 further prevent the induced currents being sensed by the sense electrodes 361D-364D, the shields also prevent the generation of the additional currents based on the induced currents in the non-active elements.

Furthermore, during the operation of the MEMS resonator system 300D, the oscillations of the MEMS resonator beams 311-314 may cause both the support arms 321-324 and the isolating spring elements 331-334 to vibrate. Without the resonator electrode shields 371 and 372, the mechanical vibrations of these non-active elements could be transduced by the nearby sense electrodes 362D and 364D, causing the sense electrodes 362D and 364D to conduct spurious resonance currents, as previously described herein. However, placing the resonator electrode shields 371 and 372 between the sense electrodes 362D and 364D and the non-active elements of the MEMS resonator 310 prevents any capacitive coupling between the vibrating non-active elements and the sense electrodes and, therefore, prevents the generation of spurious resonance currents in the sense electrodes 362D and 364D.

The resonator electrode shield 371 also facilitates balancing the parasitic capacitances sensed by the sense electrodes 361D and 362D. Similarly, the resonator electrode shield 372 further facilitates balancing the parasitic capacitances sensed by the sense electrodes 363D and 364D. Without the resonator electrode shields 371 and 372, parasitic capacitances sensed by the sense electrodes disposed inside the MEMS resonator 310 (i.e., the sense electrodes 362D and 364D) oftentimes is different than the parasitic capacitances sensed by the sense electrodes disposed outside of the MEMS resonator 310 (i.e., the sense electrodes 361D and 363D).

The resonator electrode shields 373 and 374 also prevent drive-to-drive coupling between the drive electrode 342D and the drive electrode 344D. Without the resonator electrode shields 373 and 374, the drive electrodes 342D and 344D may capacitively couple to each other via the non-active elements of the MEMS resonator 310. Placing the resonator electrode shields 373 and 374 between the drive electrodes 342D and 344D and the non-active elements of the MEMS resonator 310 eliminates capacitive coupling between the drive electrodes and the non-active elements and, therefore, prevents the drive-to-drive coupling.

Figure 3E:
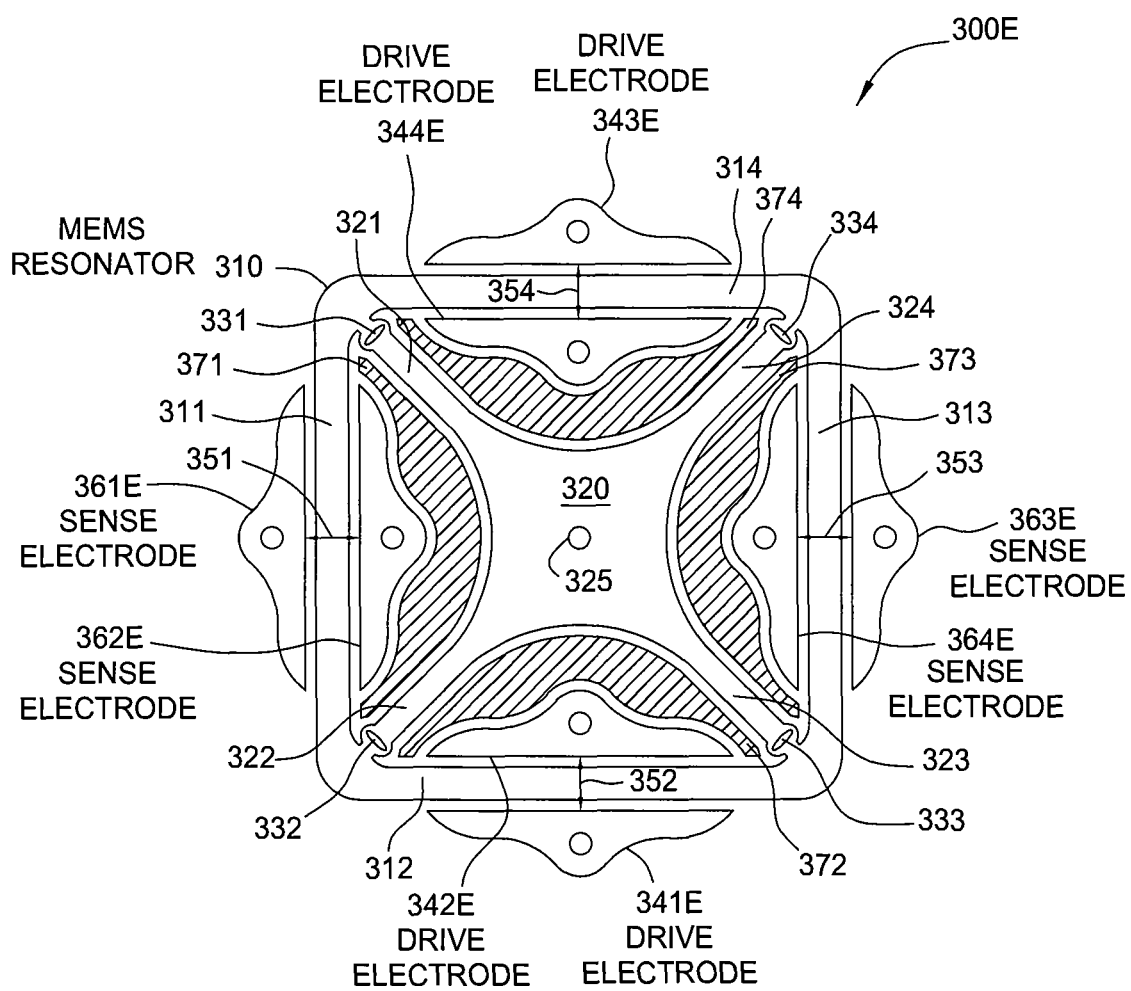

FIG. 3E illustrates resonator electrode shields 371-374 implemented with a quad-configured MEMS resonator system 300E, according to yet another embodiment of the present invention. Again, the MEMS resonator system 300E differs from the MEMS resonator systems 300A-300D by the locations of drive electrodes 341E-344E and sense electrodes 361E-364E relative to the MEMS resonator 310. Similar to FIG. 3D, in this embodiment, the drive electrodes 341E-344E and the sense electrodes 361E-364E are also differentially coupled. Thus, the sense electrodes 361E and 362E are disposed on opposite sides of the MEMS resonator beam 311, with one of the sense electrodes 361E and 362E being the positive electrode, and the other electrode being the negative electrode. Similarly, the sense electrodes 363E and 364E are disposed on the opposite sides of the MEMS resonator beam 313, with one of the sense electrodes 363E and 364E being the positive electrode, and the other electrode being the negative electrode. The drive electrodes 341E and 342E are disposed on the opposite sides of the MEMS resonator beam 312, with one of the drive electrodes 341E and 342E being the positive electrode, and the other electrode being the negative electrode. Finally, the drive electrodes 343E and 344E are disposed on the opposite sides of the MEMS resonator beam 314, with one of the drive electrodes 343E and 344E being the positive electrode, and the other electrode being the negative electrode.

In various embodiments, each of the drive electrode 341E-344E may comprise any technically feasible number of drive electrodes, and each of the sense electrodes 361E-364E may comprise any technically feasible number of sense electrodes. In such configurations, each of the MEMS resonator beams 311-314 may be disposed between M electrodes on one side and N electrodes on the other side.

Again, placing the resonator electrode shields 371-374 between the non-active elements of the MEMS resonator 310 and the resonator electrodes located within the MEMS resonator 310 acts to prevent the interfering signals previously described herein. For example, without the resonator electrode shields 372 and 374, the time-varying voltage signal applied to the drive electrodes 341E-344E could cause time-varying currents to be induced within the support arms 321-324 of the MEMS resonator 310. As previously described, these induced currents could alter the voltage on the MEMS resonator 310, which may change the magnitude of the electrostatic forces between the MEMS resonator beams 312 and 314 and the drive electrodes 341E-344E, thereby negatively impacting the generated timing signal. However, since the resonator electrode shields 372 and 374 terminate the electric field lines from the drive electrodes 341E-344E, the induced currents within the support arms 321-324 are prevented, thereby preserving the constant voltage on the MEMS resonator 310.

In addition, since the sense electrodes 361E-364E are located in close proximity to the support arms 321-324, without the resonator electrode shields 371-374, the time-varying induced currents within the support arms 321-324 could be "sensed" by the sense electrodes 361E-364E. Consequently, the sense electrodes 361E-364E could conduct not only the time-varying current based on the motion of the MEMS resonator beams 311 and 313, but could also conduct an additional current based on the induced current within the support arms 321-324 caused by the drive electrodes 341E-344E. Again, since the resonator electrode shields 372 and 374 prevent the induced currents within the support arms 321-324, and the resonator electrode shields 371 and 373 further prevent the induced currents being sensed by the sense electrodes 361E-364E, the shields also prevent the generation of the additional currents based on the induced currents in the non-active elements.

Furthermore, during the operation of the MEMS resonator system 300E, the oscillations of the MEMS resonator beams 311-314 may cause both the support arms 321-324 and the isolating spring elements 331-334 to vibrate. Without the resonator electrode shields 371 and 373, the mechanical vibrations of these non-active elements could be transduced by the nearby sense electrodes 362E and 364E, causing the sense electrodes 362E and 364E to conduct spurious resonance currents, as previously described herein. However, placing the resonator electrode shields 371 and 373 between the sense electrodes 362E and 364E and the non-active elements of the MEMS resonator 310 prevents any capacitive coupling between the vibrating non-active elements and the sense electrodes and, therefore, prevents the generation of spurious resonance currents in the sense electrodes 362E and 364E.

The resonator electrode shield 371 also facilitates balancing the parasitic capacitances sensed by the sense electrodes 361E and 362E. Similarly, the resonator electrode shield 373 further facilitates balancing the parasitic capacitances sensed by the sense electrodes 363E and 364E. Without the resonator electrode shields 371 and 373, parasitic capacitances sensed by the sense electrodes disposed inside the MEMS resonator 310 (i.e., the sense electrodes 362E and 364E) oftentimes is different than the parasitic capacitances sensed by the sense electrodes disposed outside of the MEMS resonator 310 (i.e., the sense electrodes 361E and 363E).

The resonator electrode shields 372 and 374 also prevent drive-to-drive coupling between the drive electrode 342E and the drive electrode 344E. Without the resonator electrode shields 372 and 374, the drive electrodes 342E and 344E may capacitively couple to each other via the non-active elements of the MEMS resonator 310. Placing the resonator electrode shields 372 and 374 between the drive electrodes 342E and 344E and the non-active elements of the MEMS resonator 310 eliminates capacitive coupling between the drive electrodes and the non-active elements and, therefore, prevents the drive-to-drive coupling.

Figure 4:
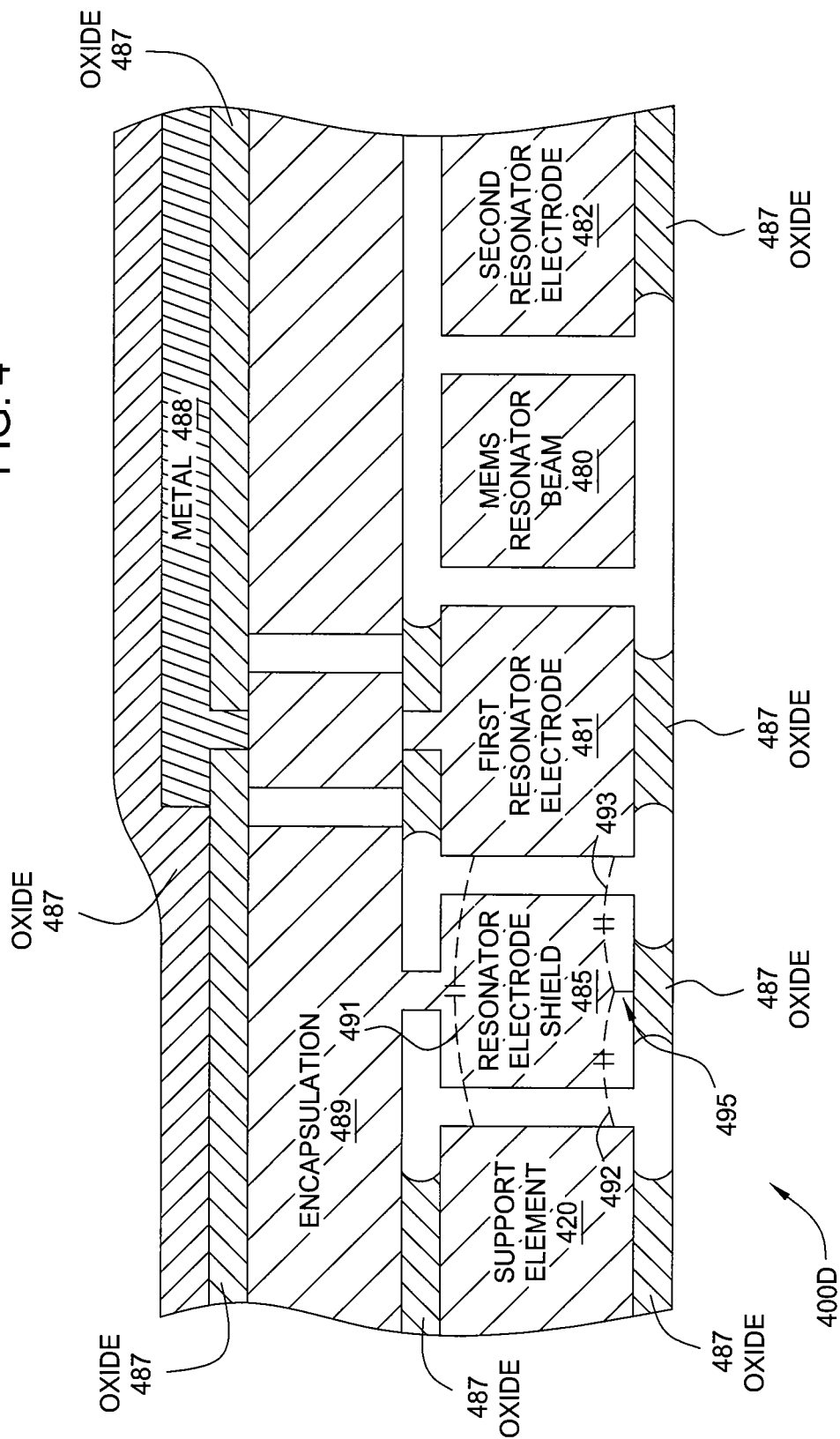
FIG. 4 illustrates a cross-sectional view of a portion of a MEMS resonator system, according to one embodiment of the present invention.

FIG. 4 illustrates a cross-sectional view of a portion of a MEMS resonator system 400, according to one embodiment of the present invention. As shown, the MEMS resonator system 400 includes, without limitation, a support element 420, a MEMS resonator beam 480, a first resonator electrode 481, a second resonator electrode 482, oxide 487, metal 488, and encapsulation 489. Similar to the systems of FIGS. 3A-3E, the support element 420 is the non-active element of the MEMS resonator system 400. In various embodiments, the first resonator electrode 481 could be either a drive or a sense electrode. The second resonator electrode 482 is then a corresponding sense or drive electrode, as the case may be. The MEMS resonator beam 480 is disposed between the first resonator electrode 481 and the second resonator electrode 482. The MEMS resonator beam 480 is one of the active elements of the MEMS resonator system 400 because, as previously described, the motion of the MEMS resonator beam 480 ultimately leads to the generation of the desired timing signal in the MEMS resonator system 400.

As also shown, the MEMS resonator system 400 includes a resonator electrode shield 485 disposed between the support element 420 and the first resonator electrode 481. If the resonator electrode shield 485 were removed from the disclosed structure, then one or more of the interfering signals described in FIGS. 3A-3E may result. For example, an unpaired electrode (not shown) could capacitively couple to the resonator electrode 481 through the support element 420, and/or the first resonator electrode 481 could induce a time-varying current in the support element 420, as indicated by dashed line 491. However, since the resonator electrode shield 485 terminates the electric field lines to and from the first resonator electrode 481, capacitive coupling may only occur between the support element 420 and the resonator electrode shield 485, as indicated by dashed line 492, and between the resonator electrode shield 485 and the first resonator electrode 481, as indicated by dashed line 493. Moreover, the resonator electrode shield 485 is connected to the ground source, as indicated by arrow 495, thus safely carrying away accumulated electrical charge, as described in more detail below, which prevents or reduces the induced currents within the support element 420.

Figure 5:
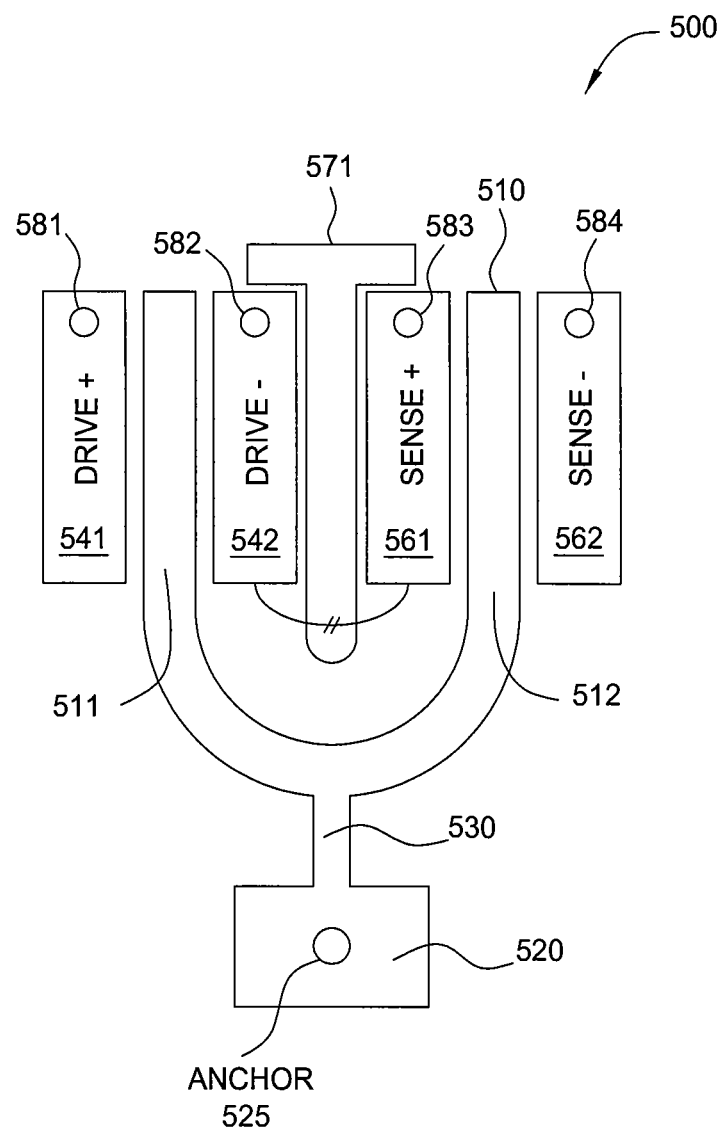
FIG. 5 illustrates differentially-coupled tuning fork-configured MEMS resonator system, according to yet another embodiment of the present invention.

FIG. 5 illustrates a differentially-coupled tuning fork-configured MEMS resonator system 500, according to yet another embodiment of the present invention. The MEMS resonator system 500 includes a MEMS resonator 510, differential drive electrodes 541 and 542, differential sense electrodes 561 and 562, and a resonator electrode shield 571 disposed between the drive electrode 542 and the sense electrode 561. The MEMS resonator 510 further includes MEMS resonator beams 511 and 512, a support element 520, including an anchor 525, and a flexure element 530. With such a configuration, the charges do not have to necessarily come through the support element 520 or out of the anchor 525, some can travel just the short distance between the MEMS resonator beams 511 and 512. Since the drive electrode 542 is located in close proximity to the sense electrode 561, the drive electrode 542 could capacitively couple directly to the sense electrode 561. Consequently, the sense electrode 561 could conduct not only the time-varying current based on the motion of the MEMS resonator beams 511 and 512, but could also conduct a feed-through current traversed past the MEMS resonator 510 to the sense electrode 561 independently of the mechanical motion of the MEMS resonator beams 511 and 512. However, the resonator electrode shield 571 terminates the electric field lines between the drive electrode 542 and the sense electrode 561, thereby preventing or reducing the generation of feed-through current.

Figure 6A:
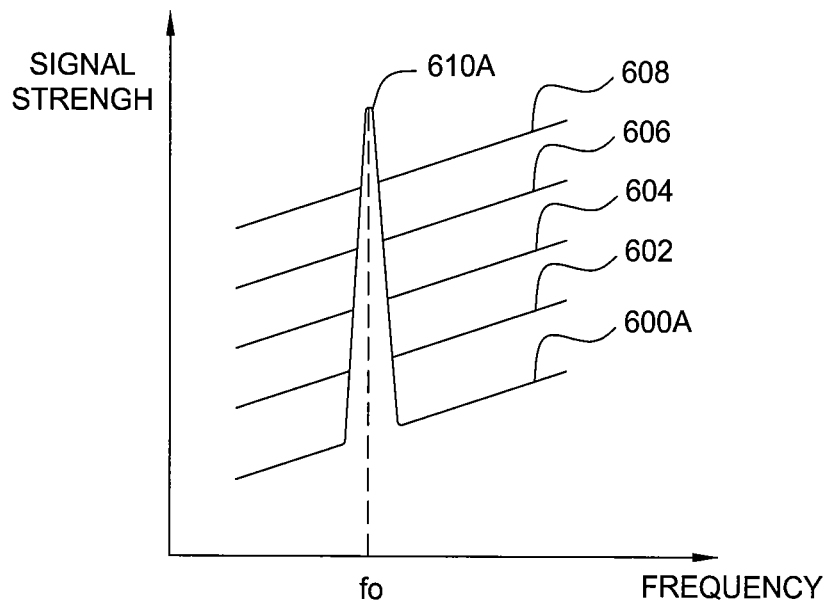
FIG. 6A illustrates the effects of feedthrough interfering signals on the frequency response of the signal generated by a MEMS resonator when the system does not include a resonator electrode shield.

As previously described herein, the existence of interfering signals within a MEMS resonator system impairs the integrity of the timing signal being generated by that system. FIG. 6A illustrates the effects of interfering signals on the frequency response of the signal generated by a MEMS resonator when the system does not include resonator electrode shields. As shown, a solid line 600A represents the desired frequency response of the signal generated by a MEMS resonator, such as the MEMS resonator 110, 210, 310, or 510, and frequency $f_0$ represents the resonant frequency of the MEMS resonator. Point 610A illustrates the signal strength of the frequency response at the resonant frequency. When the system does not include the resonator electrode shields, obtaining the frequency response depicted by line 600 becomes more difficult because interfering signals are increased relative to the desired signal due to the induced, feed-through, and spurious resonance currents generated in the system. As shown by lines 602, 604, 606 and 608, as the interfering signals increase, the desired signal response at the resonant frequency $f_0$ becomes more heavily masked.

Figure 6B:
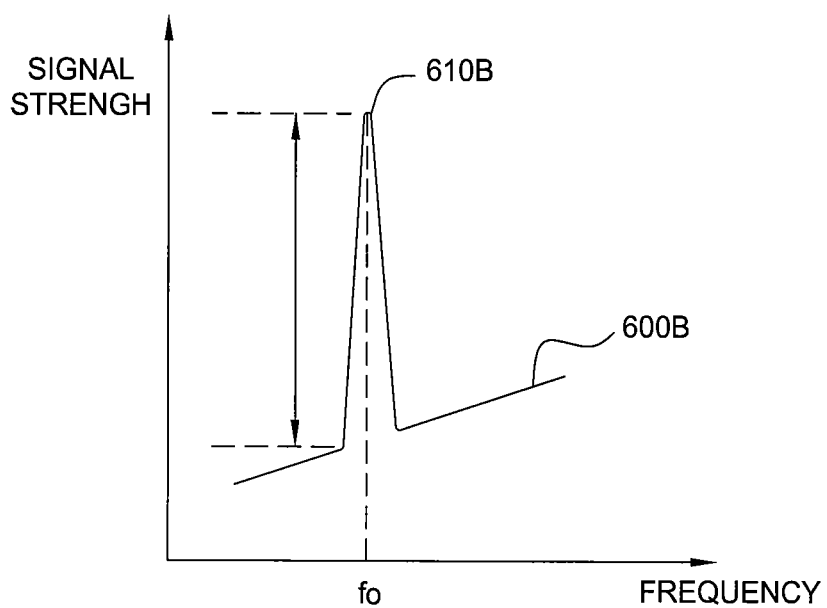
FIG. 6B illustrates the effects of feedthrough interfering signals on the frequency response of the signal generated by a MEMS resonator when the system does include a resonator electrode shield.

FIG. 6B illustrates the effects of interfering signals on the frequency response of the signal generated by a MEMS resonator when the system includes resonator electrode shields. As shown, a solid line 600B represents the frequency response of the signal generated by a MEMS resonator, such as the MEMS resonator 110, 210, 310, or 510 and frequency $f_0$ represents the resonant frequency of the MEMS resonator. Point 610B illustrates the signal strength of the frequency response at the resonant frequency. The resonator electrode shields reduce the interfering signals generated by the induced, feed-through, and spurious resonance currents. Consequently, the signal strength at the resonant frequency $f_0$ relative to the interfering signal becomes greater.

There are several design guidelines applicable to the resonator electrode shields illustrated in FIGS. 1B, 2, 3A-3E, and FIG. 5. A first guideline is that none of the resonant frequencies of the resonator electrode shield should match any of the resonant frequencies of the active elements of the MEMS resonator. Moreover, harmonics of both the MEMS resonator and the resonator electrode shield should also not match. Persons skilled in the art will recognize that a match in resonant frequencies would result in the excitation of the resonator electrode shield. In order to avoid such a situation, the material properties and geometry of the resonator electrode shields should be chosen accordingly.

A second guideline is that the resonator electrode shields should be electrically coupled to an electrical sink. This guideline arises from the fact that, during the operation, resonator electrode shields accumulate charge, and this charge could be injected into the MEMS resonator, compromising the overall performance of the MEMS resonator system. By electrically coupling the resonator electrode shields to an electrical sink, the accumulated charge may be safely carried away from the MEMS resonator. The resonator electrode shields may be coupled to the same potential as the field area, for example, to the bias or ground sources.

Another guideline is that, during the operation, the resonator electrode shields should be non-depleted or only be partially depleted of mobile carriers. If a resonator electrode shield is completely depleted of mobile carriers, then the shield could cease to be conductive, which would impede the shield's ability to terminate electric field lines. Therefore, the resonator electrode shields should be made thick enough so that the complete depletion of mobile carriers may be avoided.

Yet another guideline is that the geometry of the resonator electrode shields should render the shields mechanically stable, regardless of how the shields are affixed within the MEMS resonator system.

Figure 7:
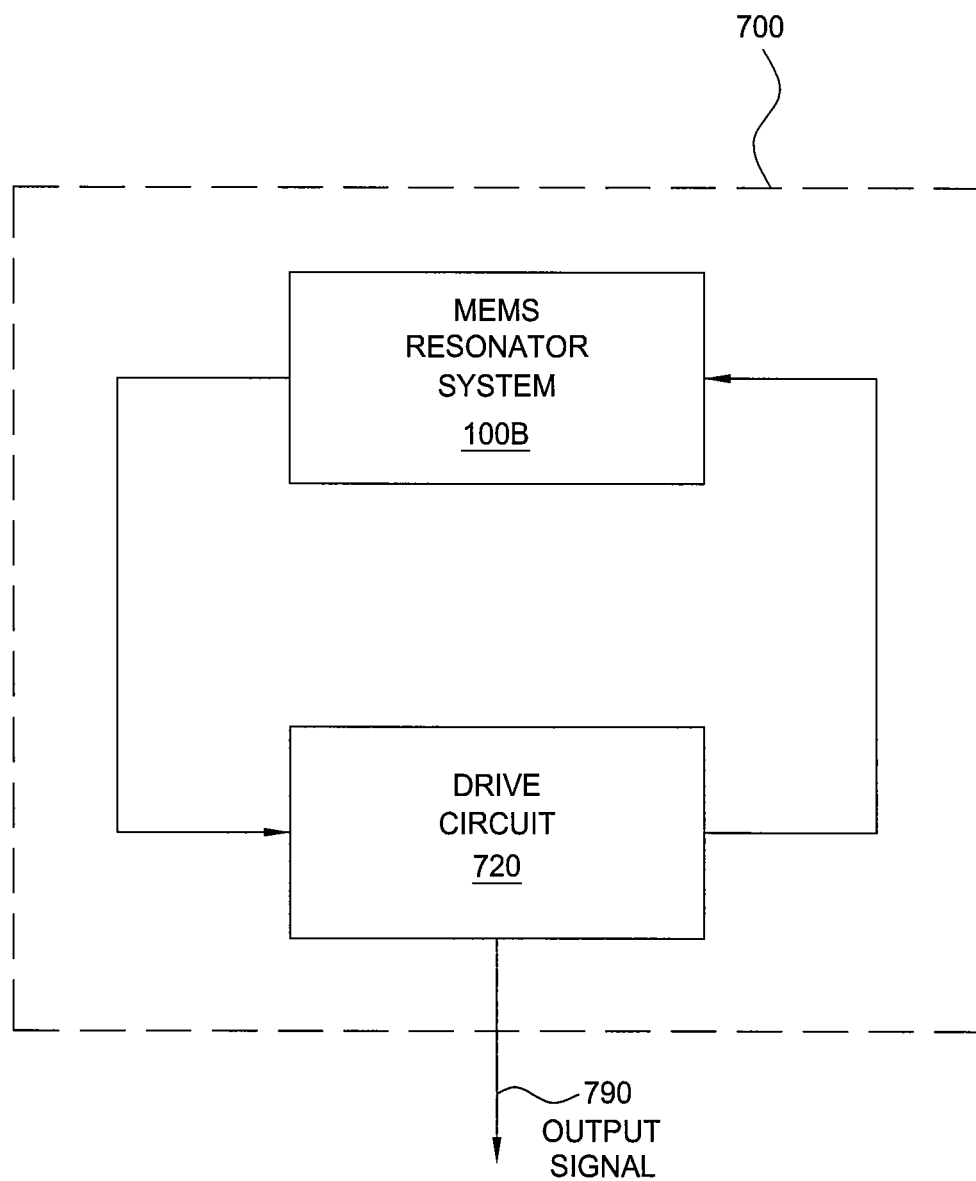
FIG. 7 is a conceptual diagram of a MEMS oscillator sustaining circuit, according to one embodiment of the present invention.

FIG. 7 is a conceptual diagram of a MEMS oscillator sustaining circuit 700, according to one embodiment of the present invention. As shown, the MEMS oscillator sustaining circuit 700 includes, without limitation, a drive circuit 720 used to drive the MEMS resonator system 100B and produce an output signal 790. Alternatively, in place of the MEMS resonator system 100B, MEMS oscillator sustaining circuit 700 may include one of the MEMS resonator systems 200, 300A, 300B, 300C, 300D, 300E, or 500.

Figure 8:
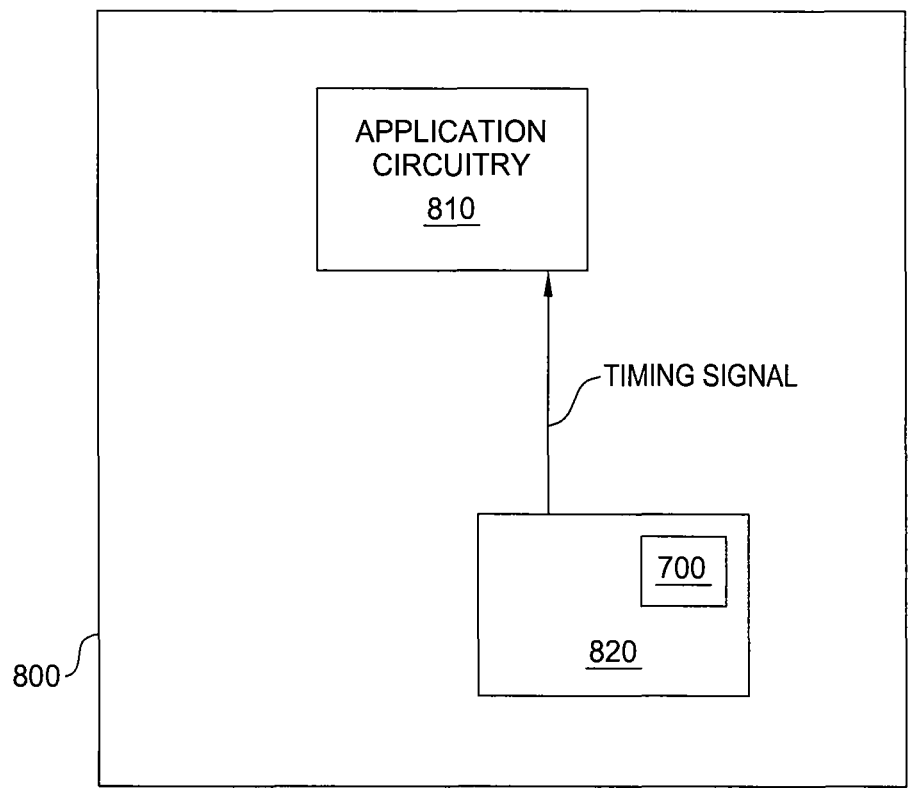
FIG. 8 is a conceptual diagram of an electronic device configured to implement one or more aspects of the present invention.
Figure 9A:
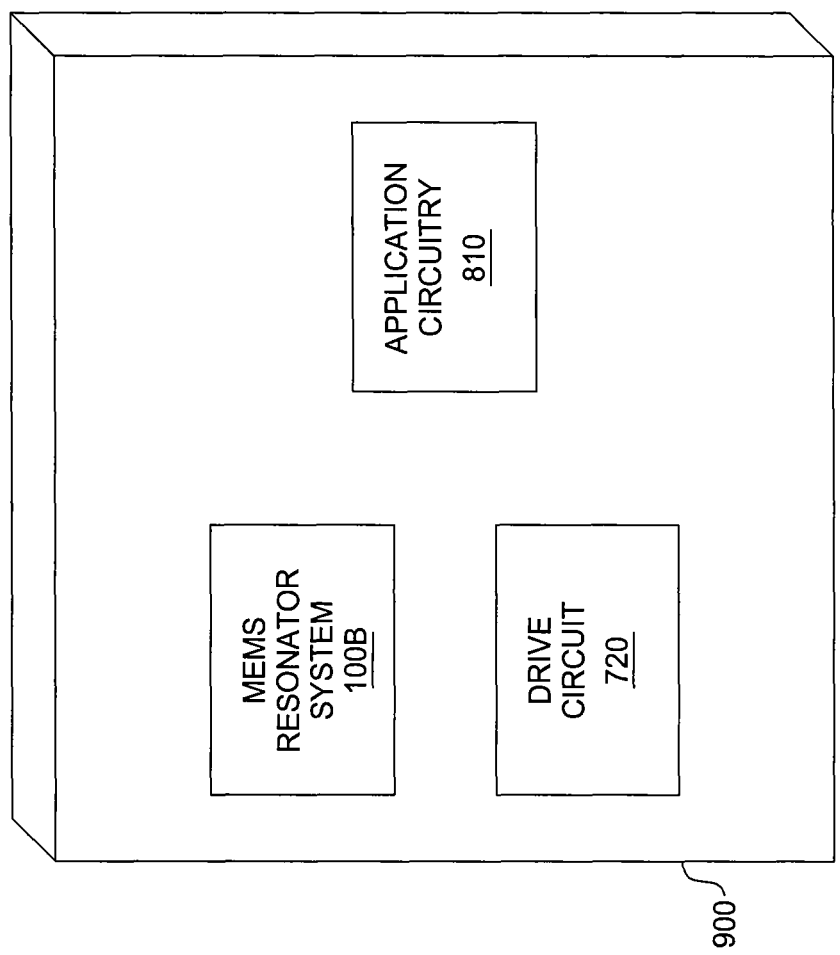
FIGS. 9A-9E illustrate various ways to position a MEMS resonator, a drive circuit, and application circuitry on one or more substrates, according to different embodiments of the present invention.
Figure 9B:
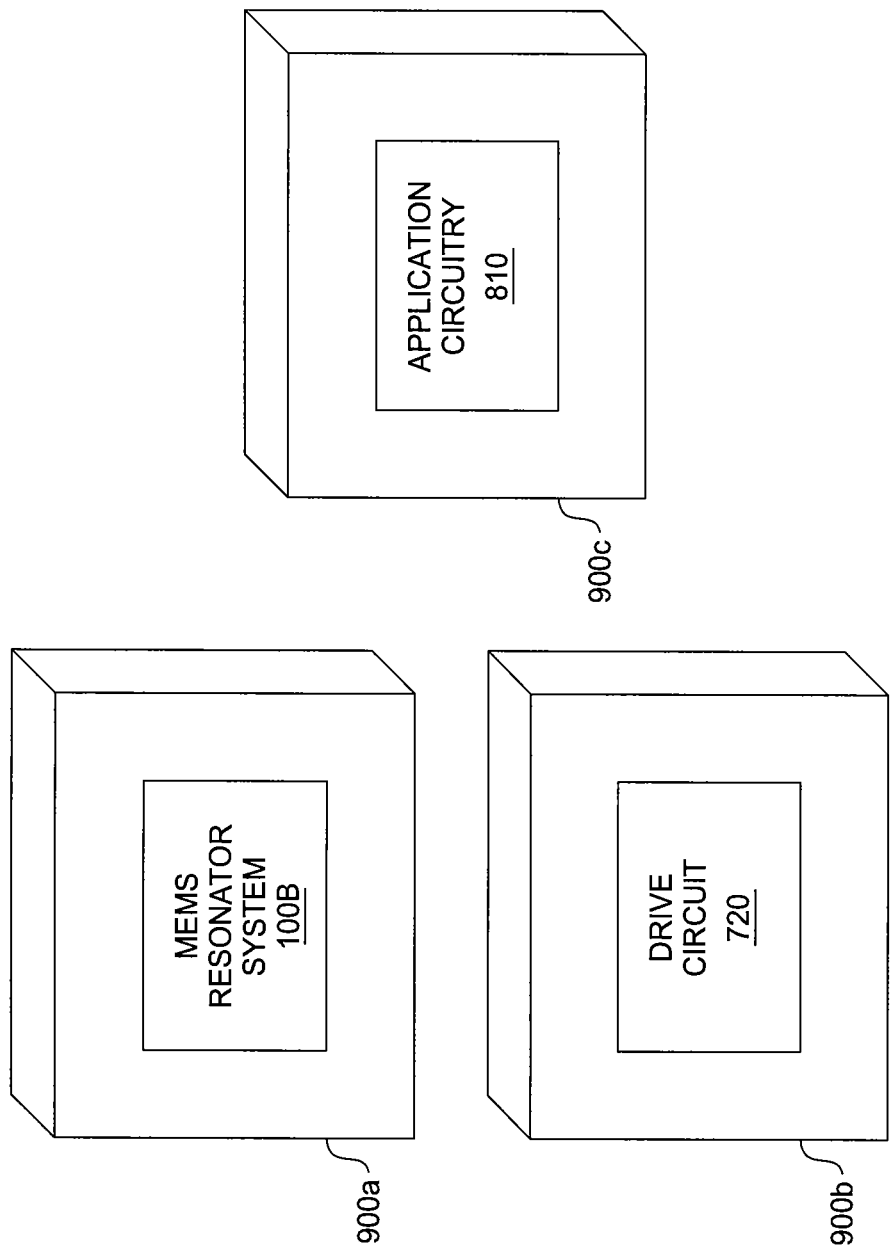
Figure 9C:
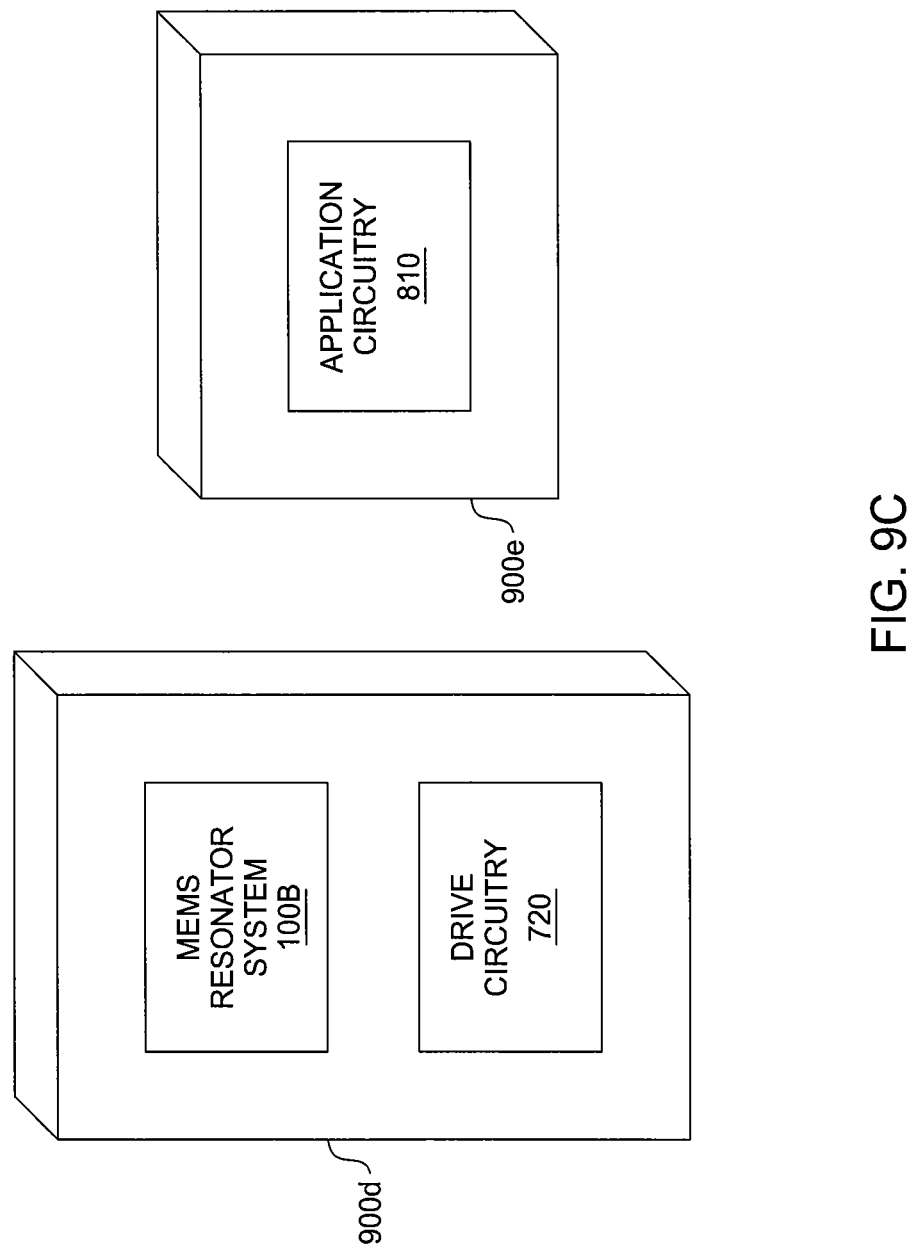
Figure 9D:
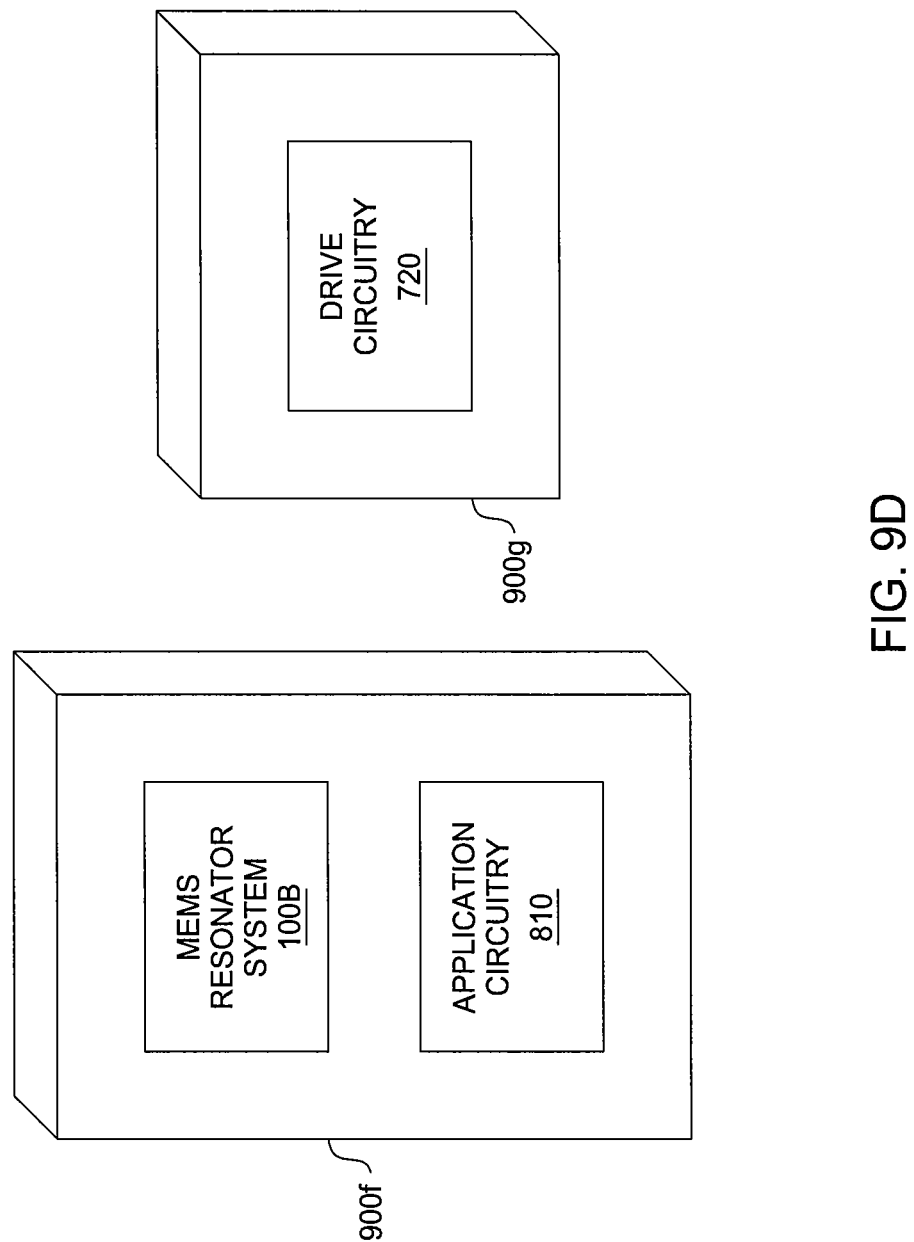
Figure 9E:
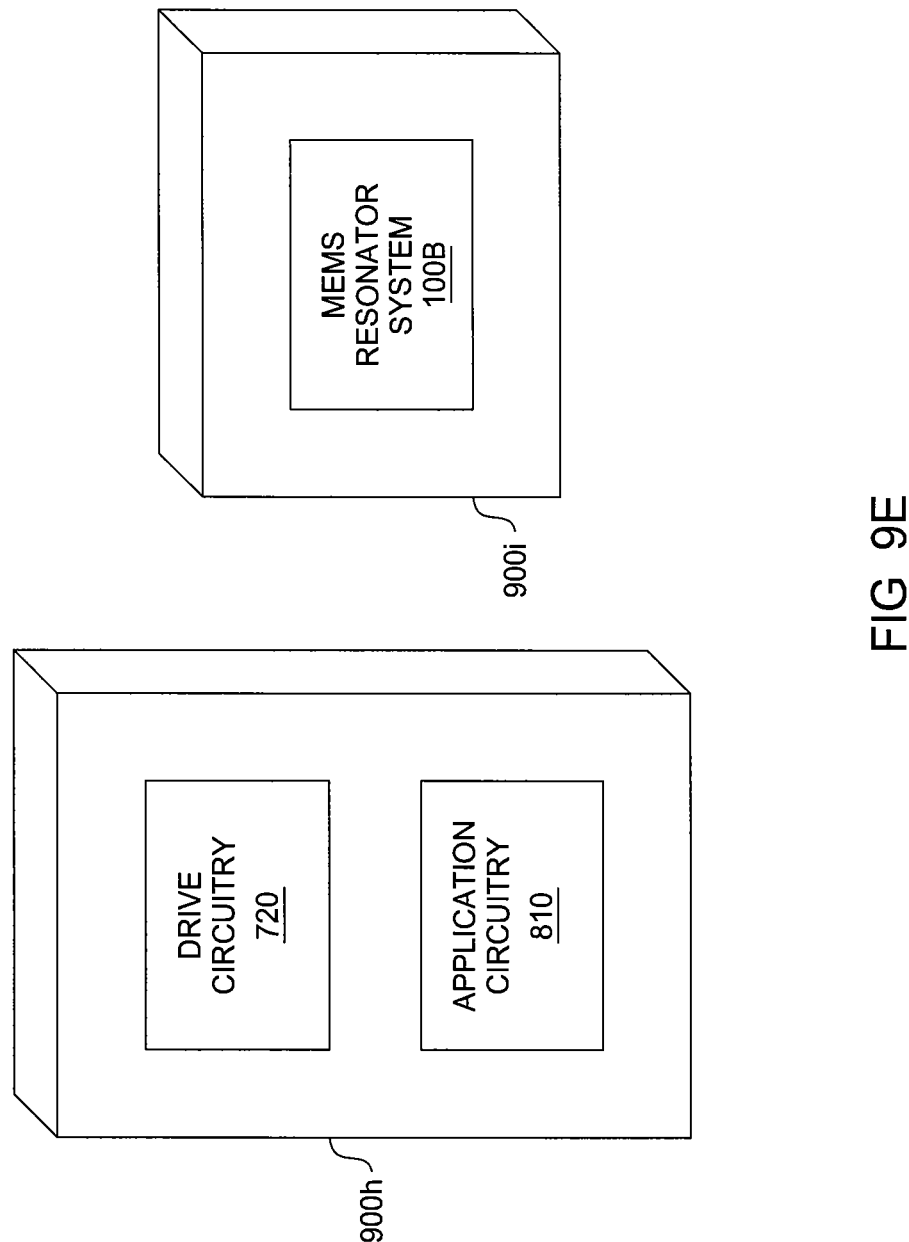

FIG. 8 is a conceptual diagram of an electronic device 800 configured to implement one or more aspects of the present invention. As shown, electronic device 800 includes, without limitation, a timing signal generator 820 configured to provide a timing signal to application circuitry 810. In one embodiment, the timing signal generator 820 includes the MEMS oscillator sustaining circuit 700. As described in FIG. 7, the drive circuit 720 of the MEMS oscillator sustaining circuit 700 produces the output signal 790 that is supplied to other circuitry in the timing signal generator 820 to produce the timing signal provided to the application circuitry 810. Electronic device 800 may be any type of electronic device that includes application circuitry requiring a timing signal. Some examples of electronic device 800 include, without limitation, an electronic wrist watch, a personal digital assistant, and a cellular phone.

Using FIGS. 7 and 8 as examples, in alternate embodiments, the MEMS resonator system 100B may be disposed on/in the same substrate or on/in different substrates than the drive circuit 720. Moreover, the application circuitry 810 may be disposed on/in the same substrates as the MEMS resonator system 100B and/or the drive circuit 720. FIGS. 9A through 9E illustrate some of the ways to position a MEMS resonator, a drive circuit, and an application circuitry on one or more substrates. In particular, the MEMS resonator system 100B and/or the drive circuit 720 and/or the application circuitry 810 may be integrated on/in the same substrate 900, as shown on FIG. 9A, on/in different substrates 900a, 900b and 900c, as shown on FIG. 9B, or on/in different substrates 900d, 900e, 900f, 900g, 900h and 900i, as shown on FIGS. 9C, 9D, and 9E. All permutations and combinations thereof are intended to fall within the scope of the present invention. In addition, the resonator electrode shields can be built in/on the same substrate as the MEMS resonator system 100B or on different substrates.

One advantage of the disclosed systems is that, among other things, undesired capacitive coupling between the resonator electrodes and the non-active elements of the MEMS resonator may be reduced by placing resonator electrode shields between the resonator electrodes and the non-active elements. In such a configuration, interfering signals are prevented because the resonator electrodes interact only with either ground or the active elements of the MEMS resonator. As a result, the deleterious effects of interfering signals are mitigated, enabling the disclosed systems to produce higher quality timing signals in a manner that is simpler and more efficient relative to prior art approaches.

While the foregoing is directed to embodiments of the present invention, other and further embodiments of the invention may be devised without departing from the basic scope thereof. For example, in alternative embodiments, a single sense electrode may be coupled to multiple drive electrodes, and, similarly, a single driver electrode may be coupled to multiple sense electrodes. Also, persons skilled in the art will recognize that the inventive principles described herein apply equally to differentially-coupled systems. Therefore, the scope of the present invention is determined by the claims that follow.

What is claimed is:

1. A microelectromechanical systems (MEMS) resonator system comprising:
   system elements, including a body, a first electrode, a second electrode and one or more support structures, a first one of the first electrode and the second electrode to supply a stimulus to cause the body to vibrate during operation of the MEMS resonator system and a second one of the first electrode and the second electrode to sense a frequency of vibration of the body during operation of the MEMS resonator system, the one or more support structures supporting the body;
   wherein further, the MEMS resonator system comprises a coupling shield configured to impede the existence of capacitive coupling between two or more of the system elements during operation of the MEMS resonator system.

2. The MEMS resonator system of claim 1 wherein the MEMS resonator system comprises an electrical contact, the electrical contact to provide a predetermined potential to the coupling shield.

3. The MEMS resonator system of claim 2 wherein the predetermined potential is one of a ground potential and a bias voltage.

4. The MEMS resonator system of claim 2 wherein the MEMS resonator system is configured to operate as an electrostatic resonator and wherein a first predetermined one of the first electrode and the second electrode is configured to always act as a drive electrode and wherein a second predetermined one of the first electrode and the second electrode is configured to always act as a sense electrode.

5. The MEMS resonator system of claim 1 wherein:
   the body comprises a first beam and a second beam;
   each of the first beam and the second beam has a longitudinal axis, a first end and a second end;
   the longitudinal axis of the first beam is being parallel to the longitudinal axis of the second beam; and
   the one or more support structures operatively mount the first end of first beam relative to the first end of the second beam.

6. The MEMS resonator system of claim 5 wherein the system elements further comprise a third electrode and wherein at least two of the first electrode, the second electrode and the third electrode, are to supply a time-varying electrical stimulus so as to cause each of the first beam and the second beam to vibrate during operation of the MEMS resonator system.

7. The MEMS resonator system of claim 6 wherein the coupling shield is configured to also impede the existence of capacitive coupling between the third electrode and at least one of the first electrode and the second electrode.

8. The MEMS resonator system of claim 1 wherein each of the first electrode and the second electrode is formed of doped silicon.

9. The MEMS resonator system of claim 1 wherein the coupling shield is to provide an electrical sink.

10. The MEMS resonator system of claim 1 wherein the coupling shield is mounted so as to impede the existence of capacitive coupling between a first support arm of the one or more support structures and a second support arm of the one or more support structures.

11. A microelectromechanical systems (MEMS) resonator system comprising:
   system elements, including a body, a first electrode, a second electrode and one or more support structures, wherein
      a first one of the first electrode and the second electrode is to supply a stimulus to cause the body to vibrate during operation of the MEMS resonator system,
      a second one of the first electrode and the second electrode is to sense a frequency of vibration of the body during operation of the MEMS resonator system, and
      the one or more support structures are to mount the body;
   wherein further, the MEMS resonator system comprises at least one coupling shield configured to impede the existence of capacitive coupling between two or more of the system elements during operation of the MEMS resonator system.

12. The MEMS resonator system of claim 11 wherein the MEMS resonator system comprises an electrical contact, the electrical contact to provide a predetermined potential to the at least one coupling shield.

13. The MEMS resonator system of claim 12 wherein the predetermined potential is one of a ground potential and a bias voltage.

14. The MEMS resonator system of claim 12 wherein the MEMS resonator system is configured to operate as an electrostatic resonator and wherein a first predetermined one of the first electrode and the second electrode is configured to always act as a drive electrode and wherein a second predetermined one of the first electrode and the second electrode is configured to always act as a sense electrode.

15. The MEMS resonator system of claim 11 wherein:
   the body comprises a first beam and a second beam;
   each of the first beam and the second beam has a longitudinal axis, a first end and a second end;
   the longitudinal axis of the first beam is being parallel to the longitudinal axis of the second beam; and
   the one or more support structures operatively mount the first end of first beam relative to the first end of the second beam.

16. The MEMS resonator system of claim 15 wherein the system elements further comprise a third electrode and wherein at least two of the first electrode, the second electrode and the third electrode, are to supply a time-varying electrical stimulus so as to cause each of the first beam and the second beam to vibrate during operation of the MEMS resonator system.

17. The MEMS resonator system of claim 16 wherein a shield of the at least one coupling shield is configured to also impede the existence of capacitive coupling between the third electrode and at least one of the first electrode and the second electrode.

18. The MEMS resonator system of claim 11 wherein each of the first electrode and the second electrode is formed of doped silicon.

19. The MEMS resonator system of claim 11 wherein a shield of the at least one coupling shield is to provide an electrical sink.

20. The MEMS resonator system of claim 11 wherein a shield of the at least one coupling shield is mounted so as to impede the existence of capacitive coupling between a first support arm of the one or more support structures and a second support arm of the one or more support structures.

* * * * *